United States Patent
Raimar et al.

(10) Patent No.: US 8,564,252 B2
(45) Date of Patent: Oct. 22, 2013

(54) BOOST BUFFER AID FOR REFERENCE BUFFER

(75) Inventors: Nandakishore Raimar, Bangalore (IN); Timothy J. Williams, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1246 days.

(21) Appl. No.: 11/983,578

(22) Filed: Nov. 9, 2007

(65) Prior Publication Data

US 2008/0203977 A1 Aug. 28, 2008

Related U.S. Application Data

(60) Provisional application No. 60/876,866, filed on Dec. 22, 2006.

(30) Foreign Application Priority Data

Nov. 10, 2006 (IN) .............................. 2085/CHE/2006

(51) Int. Cl.
H02J 7/00 (2006.01)
(52) U.S. Cl.
USPC ............................. 320/166; 320/138; 320/157
(58) Field of Classification Search
USPC .................. 320/134, 136, 157, 162, 166, 138
See application file for complete search history.

(56) References Cited

U.S. PATENT DOCUMENTS

| | | | |
|---|---|---|---|
| 4,061,987 A | 12/1977 | Nagahama | |
| 4,075,536 A * | 2/1978 | Stevens | ...................... 315/241 P |
| 4,242,604 A | 12/1980 | Smith | |
| 4,272,760 A | 6/1981 | Prazak et al. | |
| 4,344,067 A | 8/1982 | Lee | |
| 4,571,507 A | 2/1986 | Collings | |
| 4,684,824 A | 8/1987 | Moberg | |
| 4,689,581 A | 8/1987 | Talbot | |
| 4,689,740 A | 8/1987 | Moelands et al. | |
| 4,692,718 A | 9/1987 | Roza et al. | |
| 4,692,760 A | 9/1987 | Unno et al. | |
| 4,736,123 A | 4/1988 | Miyazawa et al. | |

(Continued)

FOREIGN PATENT DOCUMENTS

| | | |
|---|---|---|
| EP | 1625506 A1 | 2/2006 |
| JP | 287113 A1 | 11/1988 |

(Continued)

OTHER PUBLICATIONS

"PSoC® Mixed Signal Array" Final Data Sheet, Cypress Semiconductor Corporation, Apr. 24, 2007, Document No. 001-05356, 31 pages.

(Continued)

*Primary Examiner* — Edward Tso
*Assistant Examiner* — Aaron Piggush

(57) ABSTRACT

A circuit for charging a capacitive load to a reference voltage in a capacitive sensor measurement circuit includes a reference buffer, a boost buffer, and drive logic. The reference buffer and the boost buffer are coupled with the capacitive load to be charged. The boost buffer first charges the capacitive load towards the reference voltage at a first rate of charging, and then ceases charging. The reference buffer subsequently continues charging at a slower second rate to settle the voltage across the capacitive load to within a tolerable range of the reference voltage.

12 Claims, 10 Drawing Sheets

(56) References Cited

U.S. PATENT DOCUMENTS

| | | |
|---|---|---|
| 4,797,580 A | 1/1989 | Sunter |
| 4,839,636 A | 6/1989 | Zeiss |
| 4,855,683 A | 8/1989 | Troudet et al. |
| 4,868,525 A | 9/1989 | Dias |
| 4,882,549 A | 11/1989 | Galani et al. |
| 4,947,169 A | 8/1990 | Smith et al. |
| 4,980,653 A | 12/1990 | Shepherd |
| 4,988,983 A | 1/1991 | Wehrer |
| 5,019,729 A | 5/1991 | Kimura et al. |
| 5,036,300 A | 7/1991 | Nicolai |
| 5,043,655 A * | 8/1991 | Anholm et al. ............... 324/73.1 |
| 5,073,757 A | 12/1991 | George |
| 5,095,280 A | 3/1992 | Wunner et al. |
| 5,111,081 A | 5/1992 | Atallah |
| 5,140,197 A | 8/1992 | Grider |
| 5,142,247 A | 8/1992 | Lada, Jr. et al. |
| 5,144,254 A | 9/1992 | Wilke |
| 5,150,079 A | 9/1992 | Williams et al. |
| 5,175,884 A | 12/1992 | Suarez |
| 5,200,751 A | 4/1993 | Smith |
| 5,268,599 A | 12/1993 | Matsui |
| 5,289,138 A | 2/1994 | Wang |
| 5,304,955 A | 4/1994 | Atriss et al. |
| 5,319,370 A | 6/1994 | Del Signore et al. |
| 5,321,319 A | 6/1994 | Mahmood |
| 5,345,195 A | 9/1994 | Cordoba et al. |
| 5,349,544 A | 9/1994 | Wright et al. |
| 5,355,033 A | 10/1994 | Jang |
| 5,381,116 A | 1/1995 | Nuckolls et al. |
| 5,408,191 A | 4/1995 | Han et al. |
| 5,420,543 A | 5/1995 | Lundberg et al. |
| 5,428,319 A | 6/1995 | Marvin et al. |
| 5,432,665 A | 7/1995 | Hopkins |
| 5,440,305 A | 8/1995 | Signore et al. |
| 5,446,867 A | 8/1995 | Young et al. |
| 5,451,912 A | 9/1995 | Torode |
| 5,473,285 A | 12/1995 | Nuckolls et al. |
| 5,481,179 A | 1/1996 | Keeth |
| 5,495,205 A | 2/1996 | Parker et al. |
| 5,506,875 A | 4/1996 | Nuckolls et al. |
| 5,511,100 A | 4/1996 | Lundberg et al. |
| 5,525,933 A | 6/1996 | Matsuki et al. |
| 5,546,433 A | 8/1996 | Tran et al. |
| 5,552,748 A | 9/1996 | O'Shaughnessy |
| 5,554,942 A | 9/1996 | Herr et al. |
| 5,559,502 A | 9/1996 | Schutte |
| 5,563,553 A | 10/1996 | Jackson |
| 5,565,819 A | 10/1996 | Cooper |
| 5,583,501 A | 12/1996 | Henrion et al. |
| 5,589,783 A | 12/1996 | McClure |
| 5,594,612 A | 1/1997 | Henrion |
| 5,604,466 A | 2/1997 | Dreps et al. |
| 5,608,770 A | 3/1997 | Noguchi et al. |
| 5,610,550 A | 3/1997 | Furutani |
| 5,610,955 A | 3/1997 | Bland |
| 5,614,869 A | 3/1997 | Bland |
| 5,642,027 A * | 6/1997 | Windes et al. ................. 320/166 |
| 5,644,254 A | 7/1997 | Boudry |
| 5,666,118 A | 9/1997 | Gersbach |
| 5,668,506 A | 9/1997 | Watanabe et al. |
| 5,670,915 A | 9/1997 | Cooper et al. |
| 5,673,004 A | 9/1997 | Park |
| 5,675,813 A | 10/1997 | Holmdahl |
| 5,682,049 A | 10/1997 | Nguyen |
| 5,684,434 A | 11/1997 | Mann et al. |
| 5,686,863 A | 11/1997 | Whiteside |
| 5,689,196 A | 11/1997 | Schutte |
| 5,699,024 A | 12/1997 | Manlove et al. |
| 5,703,537 A | 12/1997 | Bland et al. |
| 5,703,540 A | 12/1997 | Gazda et al. |
| 5,726,597 A | 3/1998 | Petty et al. |
| 5,729,165 A | 3/1998 | Lou et al. |
| 5,796,312 A | 8/1998 | Hull et al. |
| 5,805,909 A | 9/1998 | Diewald |
| 5,818,370 A | 10/1998 | Sooch et al. |
| 5,825,317 A | 10/1998 | Anderson et al. |
| 5,845,151 A | 12/1998 | Story et al. |
| 5,845,181 A | 12/1998 | Bartscher |
| 5,867,015 A | 2/1999 | Corsi et al. |
| 5,870,004 A | 2/1999 | Lu |
| 5,870,345 A | 2/1999 | Stecker |
| 5,872,464 A | 2/1999 | Gradinariu |
| 5,877,656 A | 3/1999 | Mann et al. |
| 5,898,345 A | 4/1999 | Namura et al. |
| 5,949,408 A | 9/1999 | Kang et al. |
| 6,040,707 A | 3/2000 | Young et al. |
| 6,124,840 A | 9/2000 | Kwon |
| 6,141,007 A | 10/2000 | Lebling et al. |
| 6,157,266 A | 12/2000 | Tsai et al. |
| 6,191,660 B1 | 2/2001 | Mar et al. |
| 6,199,969 B1 | 3/2001 | Haflinger et al. |
| 6,211,739 B1 | 4/2001 | Synder et al. |
| 6,215,835 B1 | 4/2001 | Kyles |
| 6,219,736 B1 | 4/2001 | Klingman |
| 6,225,992 B1 | 5/2001 | Hsu et al. |
| 6,266,715 B1 | 7/2001 | Loyer et al. |
| 6,294,962 B1 | 9/2001 | Mar |
| 6,297,705 B1 | 10/2001 | Williams et al. |
| 6,357,011 B2 | 3/2002 | Gilbert |
| 6,407,641 B1 | 6/2002 | Williams et al. |
| 6,433,645 B1 | 8/2002 | Mann et al. |
| 6,466,036 B1 | 10/2002 | Philipp |
| 6,515,551 B1 | 2/2003 | Mar et al. |
| 6,525,616 B1 | 2/2003 | Williams et al. |
| 6,646,514 B2 | 11/2003 | Sutliff et al. |
| 6,701,508 B1 | 3/2004 | Bartz et al. |
| 6,708,233 B1 | 3/2004 | Fuller et al. |
| 6,708,247 B1 | 3/2004 | Barret et al. |
| 6,710,788 B1 | 3/2004 | Freach et al. |
| 6,742,076 B2 | 5/2004 | Wang et al. |
| 6,753,739 B1 | 6/2004 | Mar et al. |
| 6,807,109 B2 | 10/2004 | Tomishima |
| 6,812,678 B1 | 11/2004 | Brohlin |
| 6,909,414 B2 | 6/2005 | Tsuchi et al. |
| 6,922,063 B2 | 7/2005 | Heger |
| 6,946,920 B1 | 9/2005 | Williams et al. |
| 6,960,953 B2 | 11/2005 | Ichihara |
| 6,961,665 B2 | 11/2005 | Slezak |
| 6,966,039 B1 | 11/2005 | Bartz et al. |
| 6,989,659 B2 | 1/2006 | Menegoli et al. |
| 7,010,773 B1 | 3/2006 | Bartz et al. |
| 7,139,999 B2 | 11/2006 | Bowman-Amuah |
| 7,170,257 B2 | 1/2007 | Oh |
| 7,212,183 B2 | 5/2007 | Tobita |
| 7,276,977 B2 | 10/2007 | Self |
| 7,319,999 B2 | 1/2008 | Evans |
| 7,348,861 B1 | 3/2008 | Wu et al. |
| 7,375,593 B2 | 5/2008 | Self |
| 7,391,204 B2 | 6/2008 | Bicking |
| 7,397,226 B1 | 7/2008 | Mannama et al. |
| 7,439,777 B2 | 10/2008 | Wood |
| 7,446,747 B2 | 11/2008 | Youngblood et al. |
| 7,576,582 B2 | 8/2009 | Lee et al. |
| 7,600,156 B2 | 10/2009 | Thornley et al. |
| 7,612,527 B2 | 11/2009 | Hoffman et al. |
| 7,631,111 B2 | 12/2009 | Monks et al. |
| 7,932,774 B2 | 4/2011 | Bonaccio et al. |
| 8,085,020 B1 | 12/2011 | Bennett |
| 8,164,365 B2 | 4/2012 | Wright et al. |
| 2001/0040569 A1 | 11/2001 | Liang |
| 2002/0033804 A1 | 3/2002 | Liang et al. |
| 2002/0035618 A1 | 3/2002 | Mendez et al. |
| 2003/0122734 A1 | 7/2003 | Chien et al. |
| 2003/0233631 A1 | 12/2003 | Curry et al. |
| 2004/0046724 A1 | 3/2004 | Woo et al. |
| 2004/0056833 A1 | 3/2004 | Kitagawa et al. |
| 2004/0070559 A1 | 4/2004 | Liang |
| 2004/0145551 A1 | 7/2004 | Tobita |
| 2004/0189573 A1 | 9/2004 | Lee et al. |
| 2004/0201627 A1 | 10/2004 | Maddocks et al. |
| 2004/0217799 A1 | 11/2004 | Ichihara |
| 2004/0250231 A1 | 12/2004 | Killian et al. |
| 2005/0057482 A1 | 3/2005 | Youngblood et al. |
| 2005/0140659 A1 | 6/2005 | Hohl et al. |

(56) References Cited

U.S. PATENT DOCUMENTS

| | | | |
|---|---|---|---|
| 2006/0033474 A1 | 2/2006 | Shum | |
| 2006/0244739 A1 | 11/2006 | Tsai | |
| 2007/0024544 A1* | 2/2007 | Chung et al. | 345/76 |
| 2007/0029975 A1 | 2/2007 | Martin et al. | |
| 2007/0139338 A1 | 6/2007 | Lin et al. | |
| 2007/0170931 A1 | 7/2007 | Snyder | |
| 2008/0036473 A1* | 2/2008 | Jansson | 324/678 |
| 2008/0131145 A1 | 6/2008 | Tao et al. | |
| 2008/0203977 A1 | 8/2008 | Raimar et al. | |
| 2008/0224667 A1 | 9/2008 | Tanaka et al. | |
| 2008/0258740 A1 | 10/2008 | Wright et al. | |
| 2008/0258797 A1 | 10/2008 | Wright et al. | |
| 2008/0259017 A1 | 10/2008 | Wright et al. | |
| 2008/0259065 A1 | 10/2008 | Wright et al. | |
| 2008/0259070 A1 | 10/2008 | Snyder et al. | |
| 2008/0263243 A1 | 10/2008 | Wright et al. | |
| 2008/0263260 A1 | 10/2008 | Snyder et al. | |
| 2009/0054129 A1 | 2/2009 | Yoshimura et al. | |
| 2011/0234264 A1 | 9/2011 | Wright et al. | |
| 2011/0248692 A1 | 10/2011 | Shehu et al. | |
| 2012/0013322 A1 | 1/2012 | Dearborn | |

FOREIGN PATENT DOCUMENTS

| | | |
|---|---|---|
| JP | 291161 A1 | 11/1990 |
| JP | 297223 A1 | 12/1991 |
| JP | 5041651 A | 2/1993 |
| WO | WO8906456 A1 | 7/1989 |
| WO | PCTUS9617305 A1 | 6/1996 |
| WO | WO9736230 A1 | 10/1997 |
| WO | PCTUS9834376 A1 | 8/1998 |
| WO | PCTUS9909712 A1 | 2/1999 |

OTHER PUBLICATIONS

Robert Jania, "Cypress' CapSense Successive Approximation Algorithm", Whiat Paper CSA RJO.doc, Jan. 17, 2007, 6 pages.
USPTO Advisory Action for U.S. Appl. No. 11/857,970 dated Jan. 6, 2011; 2 pages.
USPTO Advisory Action for U.S. Appl. No. 11/965,485 dated Jun. 14, 2011; 3 pages.
USPTO Advisory Action for U.S. Appl. No. 11/965,520 dated Aug. 23, 2011; 3 pages.
USPTO Final Rejection for U.S. Appl. No. 08/868,079 dated Jan. 27, 1999; 7 pages.
USPTO Final Rejection for U.S. Appl. No. 08/868,079 dated Sep. 20, 2000; 4 pages.
USPTO Final Rejection for U.S. Appl. No. 08/868,079 dated Dec. 17, 2009; 7 pages.
USPTO Final Rejection for U.S. Appl. No. 09/048,905 dated Feb. 8, 2002; 6 pages.
USPTO Final Rejection for U.S. Appl. No. 09/048,905 dated Oct. 15, 1999; 8 pages.
USPTO Final Rejection for U.S. Appl. No. 09/207,912 dated Oct. 11, 2000; 5 pages.
USPTO Final Rejection for U.S. Appl. No. 09/275,336 dated Aug. 31, 2000; 5 pages.
USPTO Final Rejection for U.S. Appl. No. 09/511,019 dated Nov. 29, 2001; 5 pages.
USPTO Final Rejection for U.S. Appl. No. 09/721,316 dated May 3, 2002; 5 pages.
USPTO Final Rejection for U.S. Appl. No. 09/966,626 dated Jun. 26, 2002; 5 pages.
USPTO Final Rejection for U.S. Appl. No. 10/339,115 dated Jun. 24, 2004; 5 pages.
USPTO Final Rejection for U.S. Appl. No. 11/768,677 dated Jul. 27, 2009; 12 pages.
USPTO Final Rejection for U.S. Appl. No. 11/855,281 dated Dec. 16, 2010; 13 pages.
USPTO Final Rejection for U.S. Appl. No. 11/857,970 dated Sep. 1, 2010; 29 pages.
USPTO Final Rejection for U.S. Appl. No. 11/857,970 dated Oct. 22, 2010; 24 pages.
USPTO Final Rejection for U.S. Appl. No. 11/857,970 dated Aug. 19, 2009; 22 pages.
USPTO Final Rejection for U.S. Appl. No. 11/864,137 dated Apr. 12, 2011; 12 pages.
USPTO Final Rejection for U.S. Appl. No. 11/965,485 dated Apr. 13, 2011; 15 pages.
USPTO Final Rejection for U.S. Appl. No. 11/965,520 dated Jun. 8, 2011; 14 pages.
USPTO Final Rejection for U.S. Appl. No. 11/965,520 dated Aug. 6, 2012; 13 pages.
USPTO Final Rejection for U.S. Appl. No. 13/100,876 dated Jul. 19, 2012; 6 pages.
USPTO Non-Final Rejection for U.S. Appl. No. 08/259,323 dated Oct. 6, 1994; 7 pages.
USPTO Non-Final Rejection for U.S. Appl. No. 08/549,915 dated May 24, 1996; 3 pages.
USPTO Non-Final Rejection for U.S. Appl. No. 08/696,008 dated Apr. 6, 1998; 12 pages.
USPTO Non-Final Rejection for U.S. Appl. No. 08/696,008 dated Oct. 3, 1997; 3 pages.
USPTO Non-Final Rejection for U.S. Appl. No. 08/865,342 dated Feb. 3, 1998; 3 pages.
USPTO Non-Final Rejection for U.S. Appl. No. 08/865,342 dated Apr. 8, 1998; 5 pages.
USPTO Non-Final Rejection for U.S. Appl. No. 08/868,079 dated Jan. 22, 1998; 7 pages.
USPTO Non-Final Rejection for U.S. Appl. No. 08/868,079 dated Apr. 12, 2000; 6 pages.
USPTO Non-Final Rejection for U.S. Appl. No. 08/868,079 dated Jul. 1, 1999; 6 pages.
USPTO Non-Final Rejection for U.S. Appl. No. 09/048,905 dated Feb. 15, 2001; 12 pages.
USPTO Non-Final Rejection for U.S. Appl. No. 09/048,905 dated Jun. 3, 1999; 5 pages.
USPTO Non-Final Rejection for U.S. Appl. No. 09/048,905 dated Aug. 22, 2000; 12 pages.
USPTO Non-Final Rejection for U.S. Appl. No. 09/207,912 dated Jan. 26, 2001; 4 pages.
USPTO Non-Final Rejection for U.S. Appl. No. 09/207,912 dated Apr. 19, 2000; 5 pages.
USPTO Non-Final Rejection for U.S. Appl. No. 09/207,912 dated Nov. 10, 1999; 6 pages.
USPTO Non-Final Rejection for U.S. Appl. No. 09/275,336 dated Apr. 21, 2000; 6 pages.
USPTO Non-Final Rejection for U.S. Appl. No. 09/511,019 dated May 4, 2001; 5 pages.
USPTO Non-Final Rejection for U.S. Appl. No. 09/511,020 dated Nov. 28, 2000; 4 pages.
USPTO Non-Final Rejection for U.S. Appl. No. 09/721,316 dated Apr. 24, 2001; 4 pages.
USPTO Non-Final Rejection for U.S. Appl. No. 09/721,316 dated Aug. 7, 2001; 3 pages.
USPTO Non-Final Rejection for U.S. Appl. No. 09/966,626 dated Dec. 6, 2001; 6 pages.
USPTO Non-Final Rejection for U.S. Appl. No. 10/324,455 dated Aug. 21, 2003; 4 pages.
USPTO Non-Final Rejection for U.S. Appl. No. 10/324,455 dated Nov. 6, 2003; 4 pages.
USPTO Non-Final Rejection for U.S. Appl. No. 10/339,115 dated Jan. 28, 2004; 4 pages.
USPTO Non-Final Rejection for U.S. Appl. No. 10/339,115 dated Oct. 2, 2003; 3 pages.
USTPO Non-Final Rejection for U.S. Appl. No. 11/768,677 dated Jan. 6, 2010; 11 pages.
USPTO Non-Final Rejection for U.S. Appl. No. 11/768,677 dated Feb. 9, 2009; 10 pages.
USPTO Non-Final Rejection for U.S. Appl. No. 11/855,281 dated Jul. 1, 2010; 10 pages.
USPTO Non-Final Rejection for U.S. Appl. No. 11/857,970 dated Mar. 7, 2011; 32 pages.

(56) References Cited

OTHER PUBLICATIONS

USPTO Non-Final Rejection for U.S. Appl. No. 11/857,970 dated Mar. 10, 2010; 26 pages.
USPTO Non-Final Rejection for U.S. Appl. No. 11/857,970 dated Mar. 18, 2009; 21 pages.
USPTO Non-Final Rejection for U.S. Appl. No. 11/864,137 dated Jul. 7, 2010; 9 pages.
USPTO Non-Final Rejection for U.S. Appl. No. 11/864,137 dated Oct. 29, 2010; 10 pages.
USPTO Non-Final Rejection for U.S. Appl. No. 11/965,485 dated Oct. 1, 2010; 12 pages.
USPTO Non-Final Rejection for U.S. Appl. No. 11/965,520 dated Sep. 29, 2010; 11 pages.
USPTO Non-Final Rejection for U.S. Appl. No. 13/100,876 dated Dec. 7, 2011; 6 pages.
USPTO Non-Final Rejection for U.S. Appl. No. 13/182,431 dated Jul. 3, 2012; 7 pages.
USPTO Non-Final Rejection Number for U.S. Appl. No. 11/965,520 dated Dec. 7, 2011; 11 pages.
USPTO Notice of Allowance for U.S. Appl. No. 08/259,323 dated Mar. 21, 1995; 1 page.
USPTO Notice of Allowance for U.S. Appl. No. 08/549,915 dated Apr. 8, 1997; 3 pages.
USPTO Notice of Allowance for U.S. Appl. No. 08/696,008 dated Sep. 22, 1998; 4 pages.
USPTO Notice of Allowance for U.S. Appl. No. 08/865,342 dated Sep. 16, 1998; 1 page.
USPTO Notice of Allowance for U.S. Appl. No. 08/868,079 dated Nov. 14, 2000; 3 pages.
USPTO Notice of Allowance for U.S. Appl. No. 09/048,905 dated May 29, 2002; 4 pages.
USPTO Notice of Allowance for U.S. Appl. No. 09/207,912 dated May 7, 2001; 3 pages.
USPTO Notice of Allowance for U.S. Appl. No. 09/275,336 dated Sep. 27, 2000; 1 page.
USPTO Notice of Allowance for U.S. Appl. No. 09/511,019 dated Jan. 4, 2002; 4 pages.
USPTO Notice of Allowance for U.S. Appl. No. 09/511,020 dated May 2, 2001; 1 page.
USPTO Notice of Allowance for U.S. Appl. No. 09/721,316 dated Sep. 23, 2002; 5 pages.
USPTO Notice of Allowance for U.S. Appl. No. 09/966,626 dated Oct. 10, 2002; 8 pages.
USPTO Notice of Allowance for U.S. Appl. No. 10/324,455 dated Feb. 12, 2004; 4 pages.
USPTO Notice of Allowance for U.S. Appl. No. 10/339,115 dated Jan. 28, 2005; 6 pages.
USPTO Notice of Allowance for U.S. Appl. No. 11/768,677 dated Feb. 18, 2011; 9 pages.
USPTO Notice of Allowance for U.S. Appl. No. 11/768,677 dated Jun. 9, 2011; 9 pages.
USPTO Notice of Allowance for U.S. Appl. No. 11/768,677 dated Jul. 1, 2010; 7 pages.
USPTO Notice of Allowance for U.S. Appl. No. 11/768,677 dated Nov. 9, 2010; 8 pages.
USPTO Notice of Allowance for U.S. Appl. No. 11/843,216 dated Mar. 1, 2012; 7 pages.
USPTO Notice of Allowance for U.S. Appl. No. 11/843,216 dated Apr. 19, 2011; 7 pages.
USPTO Notice of Allowance for U.S. Appl. No. 11/843,216 dated Jun. 15, 2010; 6 pages.
USPTO Notice of Allowance for U.S. Appl. No. 11/843,216 dated Dec. 29, 2011; 7 pages.
USPTO Notice of Allowance for Application No. 11/843,216 dated Feb. 22, 2010; 6 pages.
Written Opinion of the International Searching Authority for International Application No. PCT/US2008/060699 dated Jun. 18, 2009; 4 pages.

Yoshikawa et al., "An EPROM Cell Structure for EPLD's Compatible with Single Poly-Si Gate Processes, IEEE Transactions on Electron Devices," vol. 37, No. 3, Mar. 1990, pp. 675-679; 5 pages.
L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.
U.S. Appl. No. 11/768,677: "Self-Calibrating Driver for Charging a Capacitive Load to a Desired Voltage," Wright et al., filed Jun. 26, 2007; 19 pages.
U.S. Appl. No. 11/843,216: "Non-Resistive Load Driver," Wright et al., filed Aug. 22, 2007; 18 pages.
U.S. Appl. No. 11/855,281: "Reducing Power Consumption in a Liquid Crystal Display," Wright et al., filed Sep. 14, 2007; 26 pages.
U.S. Appl. No. 11/857,970: "Specialized Universal Serial Bus Controller," Wright et al., filed Sep. 19, 2007; 23 pages.
U.S. Appl. No. 11/864,137 "Configurable Liquid Crystal Display Driver System," David Wright et al., filed Sep. 28, 2007; 22 pages.
U.S. Appl. No. 11/965,485: "Display Interface Buffer," Snyder et al., filed Dec. 27, 2007; 28 pages.
U.S. Appl. No. 11/965,520: "Active Liquid Crystal Display Drivers and Duty Cycle Operation," Snyder et al., filed Dec. 27, 2007; 28 pages.
U.S. Appl. No. 13/100,876: "Load Driver," Wright et al., filed May 4, 2011; 20 pages.
U.S. Appl. No. 13/182,431: "Graphical User Interface for Dynamically Reconfiguring a Programmable Device," Matthew A. Pleis; Jul. 13, 2011; 57 pages.
U.S. Appl. No. 13/432,038: "Systems and Methods for Starting up Analog Circuits," Gary Moscaluk, dated Mar. 28, 2012; 24 pages.
Application No. PCT/US08/60675: "Dual Stage Drive Buffer," David G. Wright et al., Sep. 14, 2007; 26 pages.
Application No. PCT/US08/60706: "Non-Resistive Load Driver," filed Aug. 22, 2007; 18 pages.
Bakker et al., "Micropower CMOS Temperature Sensor with Digital Output," IEEE Journal of Solid-State Circuits, Jul. 1996; 3 pages.
Cacharelis et al., "A Fully Modular 1 um CMOS Technology Incorporating EEPROM, EPROM and Interpoly Capacitors," 20th European Solid State Device Research Conference, Nottingham, Sep. 1990, pp. 547-550; 4 pages.
Cacharelis et al., "A Modular 1 um CMOS Single Polysilicon EPROM PLD Technology," Aug. 1988 IEEE, pp. 60-IEDM 88 to 63-IEDM 88; 4 pages.
Cuppens et al., "An EEPROM for Microprocessors and Custom Logic," IEEE Journal of Solid-State Circuits, vol. SC-20, No. 2, Apr. 1985, pp. 603-608; 6 pages.
CY7C63722/23 CY7C63742/43 enCoRe USB Combination Low-Speed USB & PS/2 Peripheral Controller, Cypress Semiconductor Corporation, Revised May 2000; 48 pages.
Cypress Semiconductor Marketing Brochure, "Timing Technology Products," Published Nov. 1993, a publication of Cypress Semiconductor in San Jose, CA, pp. 5-7; 5 pages.
Electronic Engineering Times, "TI's Quantum Leap," Issue 517, Dec. 19, 1988, pp. 1 and 86; 2 pages.
Frake et al., "A 9ns, Low Standby Power CMOS PLD with a Single-Poly EPROM Cell," 1989 IEEE International Solid-State Circuits Conference, Feb. 17, 1989, pp. 230-231 and 346; 3 pages.
Hoe et al., "Cell and Circuit Design for Single-Poly EPROM," IEEE Journal of Solid-State Circuits, vol. 24, No. 4, Aug. 1989, pp. 1153-1157; 5 pages.
International Search Report for International Application PCT/US08/60699 mailed Jun. 18, 2009; 6 pages.
International Search Report for International Application PCT/US08/60702 mailed Sep. 3, 2008; 2 pages.
Jan Axelson, "USB Complete: Everything You Need to Develop USB Peripherals," 3rd Edition, Copyright 1999-2005, ISBN 978-1-931448-03-1, pp. 51-59, 85-91, 225; 20 pages.
Jinbin Zhao, et al. _Steady-State and Dynamic Analysis of a Buck Converter Using a Hysteretic PWM Control_Dated 2004_5 pages.
Kazerounian et al., "A Single Poly EPROM for Custom CMOS Logic Applications," IEEE 1986 Custom Integrated Circuits Conference, 1986, pp. 59-62; 4 pages.

(56) References Cited

OTHER PUBLICATIONS

Kim et al., "A 30-MHz Hybrid Analog/Digital Clock Recovery Circuit in 2-um CMOS," IEEE Journal of Solid-State Circuits, vol. 25, No. 6, Dec. 1990, pp. 1385-1394; 10 pages.
Kim et al., "Low-Power High-Slew-Rate CMOS Buffer Amplifier for Flat Panel Display Drivers," Electronic Letters, Feb. 16, 2006, vol. 42, No. 4, <http://circuit.kaist.ac.kr/upload_files.pdf>; 2 pages.
Miyamoto et al., "An Experimental 5-V-Only 256-kbit CMOS EEPROM with a High-Performance Single-Polysilicon Cell," IEEE Journal of Solid State Circuits, vol. SC-21, No. 5, Oct. 1986, pp. 852-860; 9 pages.
Mohammad Al-Shyoukh and Hoi Lee_A Compact Fully-Integrated Extremum-Selector-Based Soft-Start Circuit for Voltage Regulators in Bulk CMOS Technologies_Oct. 2010_5 pages.
Ohsaki et al., "A Planar Type EEPROM Cell Structure by Standard CMOS Process and Applications,"VLSI Technology, Digest of Technical Papers, May 1993, pp. 55-66; 2 pages.
Ohsaki et al., "A Planar Type EEPROM Cell Structure by Standard CMOS Process for Integration with GATE Array, Standard Cell, Microprocessor and for Neural Chips," IEEE 1993 Custom Integrated Circuits Conference, 1993, pp. 23.6.1-23.6.4; 4 pages.
Ohsaki et al., "A Single Poly EEPROM Cell Structure for Use in Standard CMOS Processes," IEEE Journal of Solid-State Circuits, vol. 29, No. 3, Mar. 1994, pp. 311-316; 6 pages.
Ohsaki et al., "SIPPOS (Single Poly Pure CMOS) EEPROM Embedded FPGA by News Ring Interconnection and Highway Path," IEEE 1994 Custom Integrated Circuits Conference, 1994, pp. 189-192; 4 pages.
U.S. Appl. No. 61/566,233: "Fast Startup Circuit and Method for Ultra Low Power Analog Circuits," Gary Moscaluk, dated Dec. 2, 2011; 11 pages.
Robert A. Blauschild, "WP 3.5: An Integrated Time Reference," ISSCC94/Session 3, Analog Techniques/Paper WP 3.5, Feb. 1994, pp. 56-58; 4 pages.
S.M. M Sze, "Physics of Semiconductor Devices," 2nd Edition, John Wiley & Sons, New York, 1981, pp. 496-506; 13 pages.
Sam Yinshang Sun, "An Analog PLL-Based Clock and Data Recovery Circuit with High Input Jitter Tolerance," Reprinted from IEEE Journal of Solid-State Circuits, vol. SC-24, pp. 325-330, Apr. 1989, pp. 383-385; 4 pages.
Search Report for U.S. Appl. No. 13/432,038, Dated Mar. 2012; 12 pages.
Sugino et al., "Analysis of Writing and Erasing Procedure of Flotox EEPROM Using the New Charge Balance Condition (CBC) Model," NUPAD IV, May and Jun. 1992, pp. 65-69; 5 pages.
T.J. Giles, "A University Frequency Synthesizer IC," Aug. 1979, Philips Telecommunication Review, vol. 37, No. 3, pp. 177-181; 6 pages.
Takebuchi et al., "A Novel Integration Technology of EEPROM Embedded CMOS Logic VLSI Suitable for ASIC Applications," IEEE 1992 Custom Integrated Circuits Conference, 1992, pp. 9.6.1-9.6.4; 4 pages.
The Written Opinion of the International Searching Authority for International Application No. PCT/US08/60699 mailed Jun. 18, 2009; 4 pages.
The Written Opinion of the International Searching Authority for International Application PCT/US08/60702 mailed Sep. 3, 2008; 4 pages.
Universal Serial Bus Specification, Chapter 7—Electrical, Version 1.0; Jan. 15, 1996, pp. 111-143; 34 pages.
USPTO Advisory Action for U.S. Appl. No. 08/868,079 dated Mar. 26, 1999; 2 pages.
USPTO Advisory Action for U.S. Appl. No. 09/207,912 dated Dec. 22, 2000; 1 page.
USPTO Advisory Action for U.S. Appl. No. 10/339,115 dated Jul. 29, 2004; 3 pages.
USPTO Advisory Action for U.S. Appl. No. 11/855,281 dated Mar. 3, 2011; 4 pages.
Application No. 201210321742.5 "Fast Startup Approach for Ultra Low Power Analog Circuits," Gary P. Moscaluk et al., Filed on Sep. 3, 2012.
U.S. Appl. No. 60/876,866 "Boost buffer aid for reference buffer," Nandakishore Raimar et al., filed Dec. 22, 2006; 18 pages.
Application No. PCT/US08/60699 "Active Liquid Crystal Display Drivers and Duty Cycle Operation," filed on Apr. 17, 2008; 23 pages.
USPTO Advisory Action for U.S. Appl. No. 09/989,570 dated Aug. 14, 2003; 3 pages.
USPTO Advisory Action for U.S. Appl. No. 11/965,520 dated Oct. 17, 2012; 2 pages.
USPTO Advisory Action for U.S. Appl. No. 13/100,876 dated Oct. 4, 2012; 3 pages.
USPTO Final Rejection for U.S. Appl. No. 09/989,570 dated May 30, 2003; 9 pages.
USPTO Final Rejection for U.S. Appl. No. 09/989,571 dated Jan. 26, 2005; 11 pages.
USPTO Final Rejection for U.S. Appl. No. 13/332,178 dated Oct. 2, 2012; 19 pages.
USPTO Non-Final Rejection for U.S. Appl. No. 09/989,570 dated Jan. 2, 2003; 7 pages.
USPTO Non-Final Rejection for U.S. Appl. No. 09/989,570 dated Jan. 26, 2005; 9 pages.
USPTO Non-Final Rejection for U.S. Appl. No. 09/989,571 dated May 23, 2005; 8 pages.
USPTO Non-Final Rejection for U.S. Appl. No. 09/989,571 dated Jul. 12, 2004; 9 pages.
USPTO Non-Final Rejection for U.S. Appl. No. 11/843,216 dated Oct. 6, 2009; 7 pages.
USPTO Notice of Allowance for U.S. Appl. No. 09/989,570 dated May 19, 2005; 4 pages.
USPTO Notice of Allowance for U.S. Appl. No. 09/989,570 dated Sep. 10, 2004; 8 pages.
USPTO Notice of Allowance for U.S. Appl. No. 09/989,571 dated Sep. 13, 2005; 6 pages.
USPTO Notice of Allowance for U.S. Appl. No. 10/256,829 dated Sep. 12, 2012; 4 page.
USPTO Notice of Allowance for U.S. Appl. No. 11/843,216 dated Feb. 22, 2010; 6 pages.
USPTO Notice of Allowance for U.S. Appl. No. 13/182,43 dated Oct. 12, 2012; 7 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Non-Final Rejection for U.S. Appl. No. 11/965,520 dated Dec. 18, 2012; 13 pages.
USPTO Non-Final Rejection for U.S. Appl. No. 11/855,281 dated Jan. 22, 2013; 8 pages.
USPTO Requirement for Restriction for U.S. Appl. No. 13/432,038, dated Jan. 14, 2013; 5 pages.
USPTO Non-Final Rejection for U.S. Appl. No. 13/432,038 dated Mar. 7, 2013; 8 pages.
USPTO Advisory Action for U.S. Appl. No. 11/965,485 dated Nov. 21, 2012; 3 pages.
USPTO Non Final Rejection for U.S. Appl. No. 11/855,281 dated Jan. 22, 2013; 8 pages.
USPTO Notice of Allowance for U.S. Appl. No. 13/100,876 dated May 17, 2013; 8 pages.
USPTO Notice of Allowance for U.S. Appl. No. 13/432,038 dated Jun. 12, 2013; 6 pages.
USPTO Notice of Allowance for U.S. Appl. No. 11/983,578 dated Mar. 14, 2013; 10 pages.
USPTO Final Rejection for U.S. Appl. No. 11/855,281 dated Jul. 5, 2013; 9 pages.
USPTO Final Rejection for U.S. Appl. No. 11/965,520 dated Jul. 8, 2013; 10 pages.

\* cited by examiner

BOOST BUFFER AID FOR REFERENCE BUFFER

CROSS-REFERENCE TO RELATED APPLICATIONS

This application claims the priority of India Patent Application Number 2085/CHE/2006, filed Nov. 10, 2006, and claims the benefit of U.S. Provisional Patent Application No. 60/876,866, filed Dec. 22, 2006, all of which are incorporated by reference herein in their entirety.

TECHNICAL FIELD

This invention relates to the field of user interface devices and, in particular, to capacitive touch-sensor devices.

BACKGROUND

In general, capacitive touch sensors are intended to replace mechanical buttons, knobs, and other similar mechanical user interface controls. Capacitive sensors allow the elimination of complicated mechanical switches and buttons and provide reliable operation under harsh conditions. Also, capacitive sensors are widely used in modern consumer applications, providing new user interface options in the existing products.

Capacitive sensing applications may be implemented in a variety of electronic systems. Some capacitive sensing algorithms used by such systems require the initial charging of capacitive loads. FIG. 1 is a circuit diagram illustrating a conventional circuit for charging a capacitive load. With regard to FIG. 1, charging circuit 100 includes capacitive load 101, reference buffer 102, enable pin 103, and reference voltage pin 104. Charging circuit 100 begins charging capacitive load 101 when reference buffer 102 is enabled by an input received at enable pin 103. Reference buffer 102 then drives a current into capacitive load 101 until the voltage across capacitive load 101 reaches reference voltage $V_{REF}$, which is applied to the reference voltage pin 104 of reference buffer 102.

BRIEF DESCRIPTION OF THE DRAWINGS

The present invention is illustrated by way of example, and not by way of limitation, in the figures of the accompanying drawings.

DETAILED DESCRIPTION

Described herein is a method and apparatus for charging a capacitive load for use in an application such as a capacitive sensing application. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Figure 1:
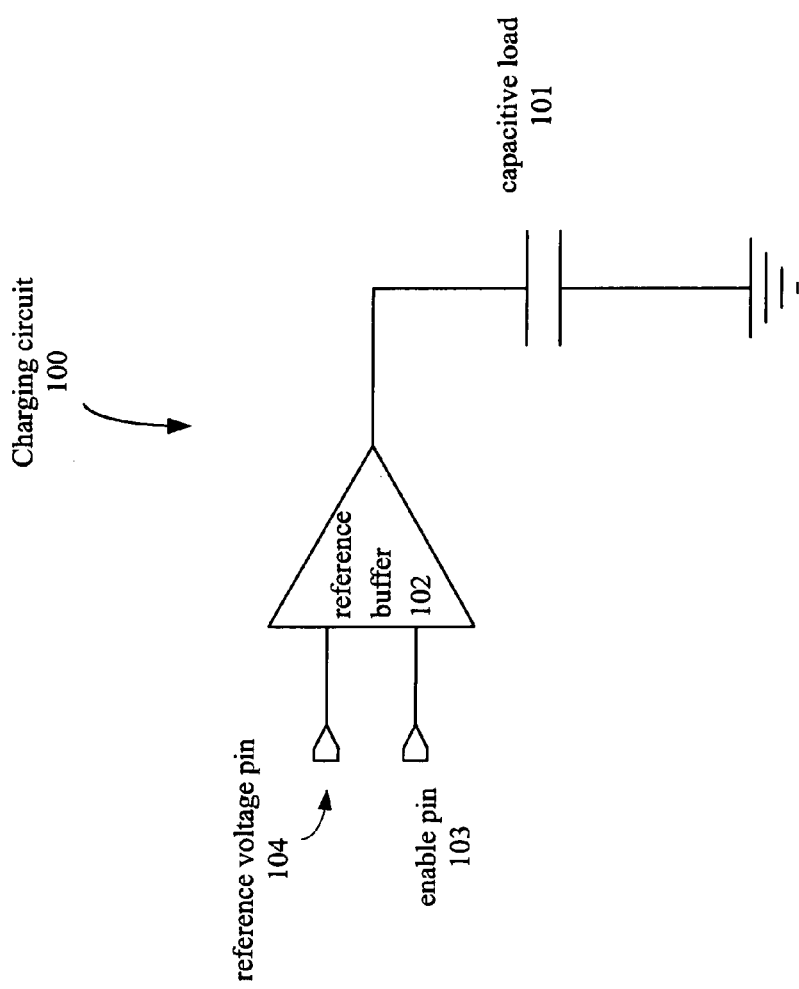
FIG. 1 is a circuit diagram illustrating a conventional circuit for charging a capacitive load.
Figure 2:
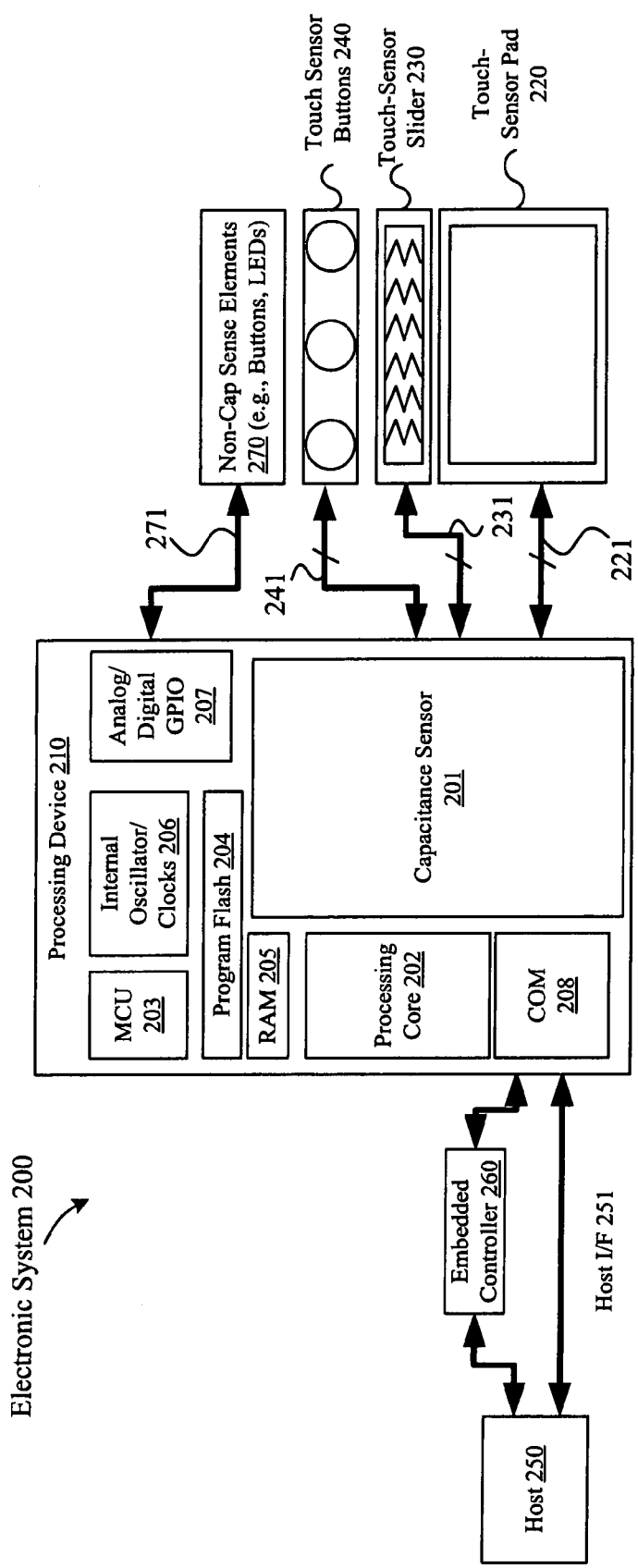
FIG. 2 is a block diagram illustrating one embodiment of an electronic system having a processing device for detecting the presence of a conductive object.

FIG. 2 illustrates a block diagram of one embodiment of an electronic system having a processing device 210 for detecting a presence of a conductive object. Electronic system 200 includes processing device 210, touch-sensor pad 220, touch-sensor slider 230, touch-sensor buttons 240, host processor 250, embedded controller 260, and non-capacitance sensor elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus. Processing device 210 may also include memory, such as random access memory (RAM) 205 and program flash 204. RAM 205 may be static RAM (SRAM), and program flash 204 may be a non-volatile storage, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. Analog block array also may be configured to implement a variety of analog circuits (e.g., ADC, analog filters, etc.) using, in one embodiment, configurable UMs. The analog block array may also be coupled to the GPIO 207.

As illustrated, capacitance sensor 201 may be integrated into processing device 210. Capacitance sensor 201 may include analog I/O for coupling to an external component, such as touch-sensor pad 220, touch-sensor slider 230, touch-sensor buttons 240, and/or other devices. Capacitance sensor 201 and processing device 202 are described in more detail below.

It should be noted that the embodiments described herein are not limited to touch-sensor pads for notebook implementations, but can be used in other capacitive sensing implementations, for example, the sensing device may be a touch screen, a touch-sensor slider 230, or touch-sensor buttons 240 (e.g., capacitance sensing buttons). It should also be noted that the embodiments described herein may be implemented in other sensing technologies than capacitive sensing, such as resistive, optical imaging, surface wave, infrared, dispersive signal, and strain gauge technologies. Similarly, the operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

In one embodiment, the electronic system 200 includes a touch-sensor pad 220 coupled to the processing device 210 via bus 221. Touch-sensor pad 220 may include a multi-dimension sensor array. The multi-dimension sensor array includes multiple sensor elements, organized as rows and columns. In another embodiment, the electronic system 200 includes a touch-sensor slider 230 coupled to the processing device 210 via bus 231. Touch-sensor slider 230 may include a single-dimension sensor array. The single-dimension sensor array includes multiple sensor elements, organized as rows, or alternatively, as columns. In another embodiment, the electronic system 200 includes touch-sensor buttons 240 coupled to the processing device 210 via bus 241. Touch-sensor buttons 240 may include a single-dimension or multi-dimension sensor array. The single- or multi-dimension sensor array may include multiple sensor elements. For a touch-sensor button, the sensor elements may be coupled together to detect a presence of a conductive object over the entire surface of the sensing device. Alternatively, the touch-sensor buttons 240 may have a single sensor element to detect the presence of the conductive object. In one embodiment, touch-sensor buttons 240 may include a capacitive sensor element. Capacitive sensor elements may be used as non-contact sensor elements. These sensor elements, when protected by an insulating layer, offer resistance to severe environments.

The electronic system 200 may include any combination of one or more of the touch-sensor pad 220, touch-sensor slider 230, and/or touch-sensor button 240. In another embodiment, the electronic system 200 may also include non-capacitance sensor elements 270 coupled to the processing device 210 via bus 271. The non-capacitance sensor elements 270 may include buttons, light emitting diodes (LEDs), and other user interface devices, such as a mouse, a keyboard, or other functional keys that do not require capacitance sensing. In one embodiment, buses 271, 241, 231, and 221 may be a single bus. Alternatively, these buses may be configured into any combination of one or more separate buses.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) line 251. Alternatively, processing block 210 may also be coupled to embedded controller 260 to communicate with the external components, such as host 250. In one embodiment, the processing device 210 is configured to communicate with the embedded controller 260 or the host 250 to send and/or receive data.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be a Programmable System on a Chip (PSoC™) processing device, manufactured by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like.

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 210 may also be done in the host.

Capacitance sensor 201 may be integrated into the IC of the processing device 210, or alternatively, in a separate IC. Alternatively, descriptions of capacitance sensor 201 may be generated and compiled for incorporation into other integrated circuits. For example, behavioral level code describing capacitance sensor 201, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above.

In one embodiment, electronic system 200 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

Figure 3:
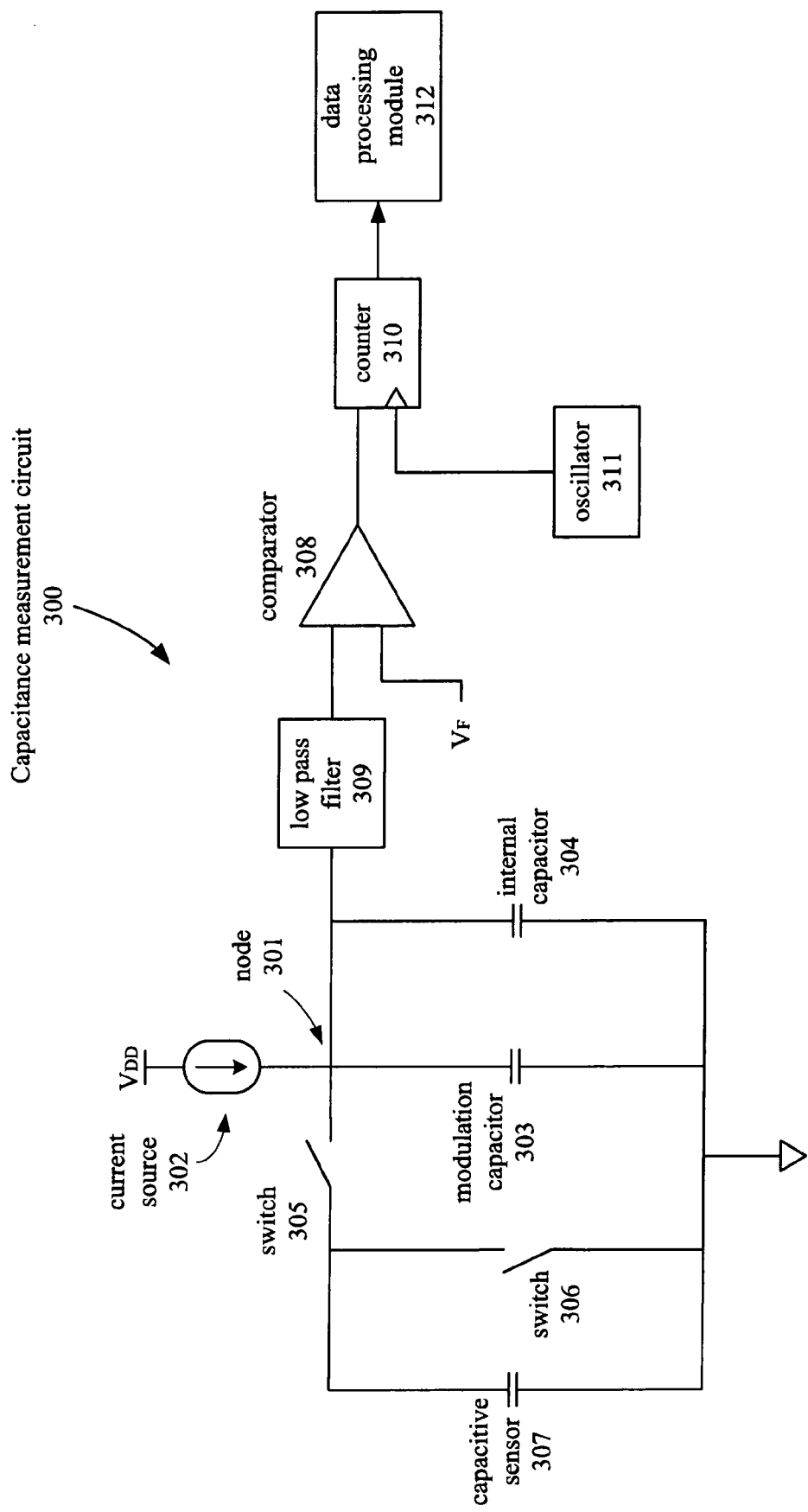
FIG. 3 is a circuit diagram illustrating one embodiment of a circuit used to detect capacitance of a capacitive sensor.

FIG. 3 is a circuit diagram illustrating one embodiment of a circuit used to detect capacitance of a capacitive sensor by a method of Capacitance Successive Approximation (CSA). Although CSA is described herein, alternative embodiments may be practiced with other capacitive sensing techniques known in the art such as charge transfer capacitive sensing algorithms. In one embodiment, capacitance measurement circuit 300 may be included as part of capacitance sensor 201. Capacitance measurement circuit 300 includes node 301, current source 302, modulation capacitor 303, internal capacitor 304, switch 305, switch 306, capacitive sensor 307, comparator 308, low-pass filter 309, counter 310, oscillator 311, and data processing module 312.

In one embodiment, capacitance measurement circuit 300 begins the process of detecting capacitance of capacitive sensor 307 by causing an initial voltage approximately equal to reference voltage level $V_{REF}$ to appear between node 301 and ground. To this end, current source 302 drives a charging current $I_{DAC}$ into node 301, causing charge to be stored on modulation capacitor 303 and internal capacitor 304. Subsequently, switch 305 and switch 306 operate in a non-overlapping manner to alternately and repeatedly connect capacitive sensor 307 first to node 301 and then to ground. When switch 305 is closed, the voltage on capacitive sensor 307 equalizes with the voltage on modulation capacitor 303 and internal capacitor 304. Concurrently, the $I_{DAC}$ current from current source 302 continues to charge up node 301. Switch 305 subsequently opens, disconnecting capacitive sensor 307 from node 301. When switch 306 closes, capacitive sensor 307 is discharged to ground. The charge-discharge cycle of capacitive sensor 307 with switch 305 and switch 306 when operating as described can be represented as an effective resistance $R_{EFF}$ between node 301 and ground. The value of effective resistance $R_{EFF}$, represented in terms of the switching frequency f of switch 305 and switch 306 and the capacitance Cs of capacitive sensor 307, is described by Equation 1 below.

$$R_{EFF} = \frac{1}{f \cdot C_s} \quad \text{(Equation 1)}$$

According to Ohm's Law, an effective voltage $V_N$ appears across capacitive sensor 307 at node 301 given by Equation 2 below.

$$V_N = I_{DAC} \cdot R_{EFF} = I_{DAC} \cdot \frac{1}{f \cdot C_s} \quad \text{(Equation 2)}$$

According to one embodiment, the output current $I_{DAC}$ of current driver 302 is adjusted so that the voltage $V_N$ at node 301 is less than the final voltage $V_F$ applied to an input of comparator 308. In other embodiments, the switching frequency f of switch 305 and switch 306 may be adjusted to achieve a desired value of $V_N$. In one embodiment, various parameters may be adjusted such that the voltage $V_N$ at node 301 approximates initial reference voltage level $V_{REF}$, so that when the circuit reaches steady state operation, the voltage $V_N$ at node 301 is approximately equal to $V_{REF}$.

In one embodiment, once the voltage $V_N$ at node 301 is within tolerable limits of $V_{REF}$, the measurement sequence begins. Current driver 302 charges capacitors 303 and 304, increasing the voltage $V_N$ at node 301 towards $V_F$, while switches 305 and 306 continue to operate with capacitive sensor 307 as described above, providing the effective resistance $R_{EFF}$ between node 301 and ground. Once node 301 settles, the voltage at this node, $V_N$ as given by Equation 2, provides a measure of the sensor capacitance 307. At this point, switch 305 may be kept open and $I_{DAC}$ current from current source 302 may be turned off to preserve this voltage $V_N$ at node 301. One method to measure this voltage (and hence the capacitance 307) is described below. A current $I_{DAC2}$, which may be different from the previous $I_{DAC}$ value, is applied to charge up the voltage at node 301. Counter 310, which is clocked by oscillator 311 is enabled to measure the time required for $V_N$ to reach $V_F$. While counter 310 is enabled, counter 310 records the number of cycles output by oscillator 311. The voltage at node 301 is filtered through low-pass filter 309 and then applied to the input of comparator 308. When this voltage, after filtering, exceeds $V_F$, comparator 308 trips and disables counter 310. Counter 310 then transmits the resulting count value to data processing module 312. Thus, counter 310 transmits to data processing module 312 the number of oscillations produced by oscillator 311 during the time required for $V_N$ to rise to $V_F$.

In accord with Equation 1, $R_{EFF}$ is dependent on the capacitance of capacitive sensor 307. Thus, a physical input on capacitive sensor 307, such as a finger or other object, that affects the capacitance of capacitive sensor 307 will change the value of $R_{EFF}$. For example, a finger in proximity to capacitive sensor 307 may cause an increase in capacitance of capacitive sensor 307. This corresponds to a decrease in the effective resistance $R_{EFF}$. According to Ohm's law the voltage across $R_{EFF}$, which is the voltage $V_N$ at node 301, decreases. Therefore, the duration of time required to charge capacitors 303 and 304 so that $V_N$ is equal to $V_F$ increases, since $V_N$ begins from a lower voltage level. As a result, counter 310 detects a greater number of cycles output by oscillator 311 before counter 310 is disabled by comparator 308. This increase in the count value can then be used to determine that an input was received on the capacitive sensor 307.

In one embodiment, node 301 can be pre-charged before measurement begins. Pre-charging node 301 can aid the CSA successive approximation process by providing a starting voltage that is closer to $V_{REF}$. Therefore, capacitance measurement circuit 300 more quickly achieves steady state operation and is sooner available to begin measurement. Alternative embodiments may apply pre-charging to methods other than CSA for measuring capacitance of a capacitive sensor, such as charge transfer capacitive sensing algorithms. Pre-charging node 301 requires charging of a capacitive load resulting from the combination of capacitors 303 and 304.

Figure 4:
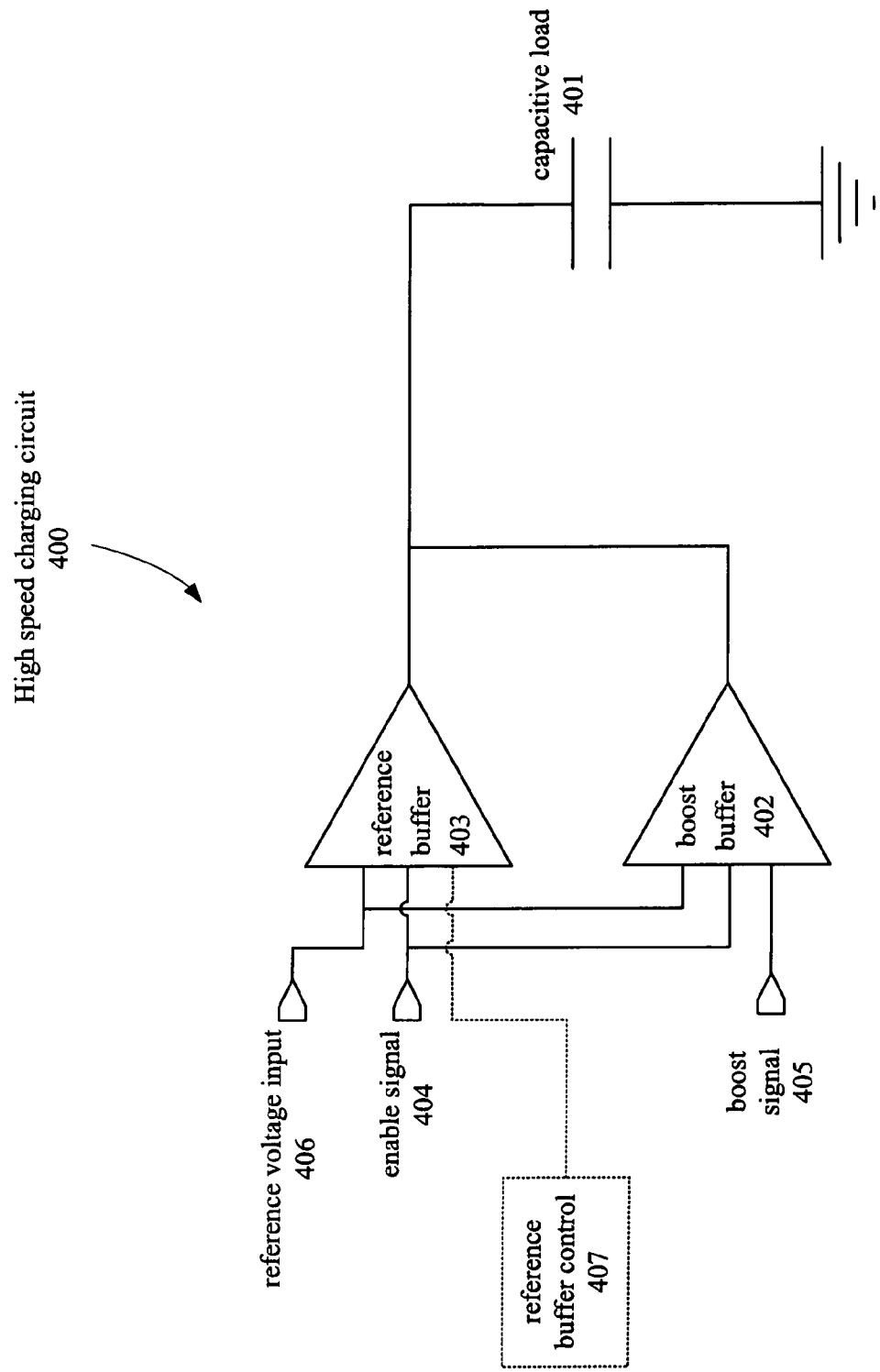
FIG. 4 is a circuit diagram illustrating an embodiment of a circuit for high speed charging of a capacitive load.

FIG. 4 is a circuit diagram illustrating an embodiment of a circuit having two buffers for charging a capacitive load at a higher speed as compared to charging circuit 100. High speed charging circuit 400 includes capacitive load 401, boost buffer 402, reference buffer 403, enable signal 404, boost signal 405, reference voltage input 406, and reference buffer control 407. According to one embodiment, high speed charging circuit 400 charges capacitive load 401 using boost buffer 402 and reference buffer 403. According to one embodiment, capacitive load 401 may represent the combined capacitances of various components. When the enable signal 404 and the boost signal 405 are concurrently asserted, boost buffer 402 drives current into capacitive load 401 until the voltage across capacitive load 401 reaches the voltage $V_{REF}$ applied to reference voltage input 406. When the enable signal 404 is asserted, reference buffer 403 may likewise drive current into capacitive load 401 until the voltage across capacitive load 401 reaches the voltage $V_{REF}$ applied to reference voltage input 406. According to one embodiment, reference buffer 403 may be a two stage differential amplifier with high gain. Reference buffer 403 may also be a tristate buffer. According to one embodiment, boost buffer 402 may be capable of charging capacitive load 401 at a faster rate than reference buffer 403.

According to one embodiment, high speed charging circuit 400 may begin charging capacitive load 401 upon the assertion of the enable signal 404 and the boost signal 405. Both reference buffer 403 and boost buffer 402 then charge capacitive load 401 at a high rate towards $V_{REF}$. Subsequently, boost signal 405 is negated, disabling boost buffer 402. In one embodiment, boost buffer 402 may be tristated when boost signal 405 is negated. Reference buffer 403 then continues charging capacitive load 401 towards $V_{REF}$ at a relatively slower rate until the voltage across capacitive load 401 reaches the same level as $V_{REF}$. When the voltage across capacitive load 401 reaches the same level as $V_{REF}$, the enable signal 404 may be negated, thus disabling reference buffer 403 and ending the charge cycle. In one embodiment, the reference buffer may be tristated when enable signal 404 is negated. In one embodiment, boost buffer 402 and reference buffer 403 have the same voltage $V_{REF}$ applied to their respective voltage reference inputs. In other embodiments, boost buffer 402 and reference buffer 403 have different voltages applied to their respective reference voltage inputs.

In one embodiment, a reference buffer control 407 may also be included in high speed charging circuit 400 to control the output state of the reference buffer. Thus reference buffer control 407 may operate to tristate or otherwise disable the reference buffer 403. In one embodiment, reference buffer control 407 may disable reference buffer 403 after determining that a period of time has elapsed. For example, reference buffer control 407 may disable reference buffer 403 based on an indication that sufficient time has passed to allow the voltage across capacitive load 401 to settle within a tolerable range of $V_{REF}$. In other embodiments, reference buffer control 407 may disable reference buffer 403 based on other conditions.

Figure 5:
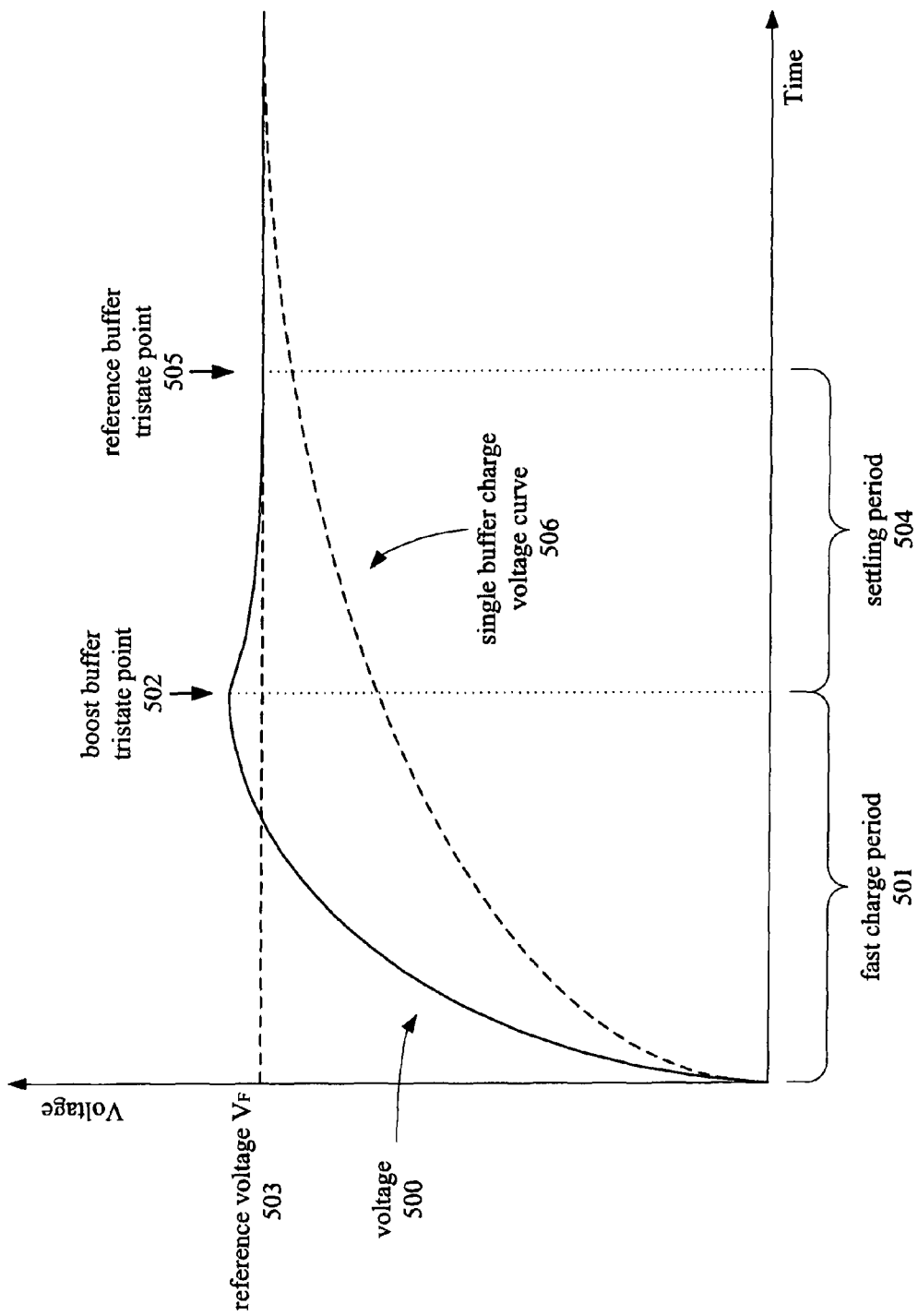
FIG. 5 is a graph illustrating charging performance of one embodiment of a circuit for charging a capacitive load.

FIG. 5 is a graph illustrating charging performance of one embodiment of a circuit for charging a capacitive load, such as high speed charging circuit 400. The graph depicts the change in voltage 500 across capacitive load 401 as capacitive load 401 is being charged by high speed charging circuit 400. The graph further depicts fast charge period 501, boost buffer tristate point 502, reference voltage 503, settling period 504, reference buffer tristate point 505, and single buffer charge voltage curve 506.

As depicted in FIG. 5, the voltage 500 across capacitive load 401 increases over time during the fast charge period 501. In one embodiment, fast charge period 501 ends when the boost buffer 402 tristates at the boost buffer tristate point 502. In one embodiment, boost buffer 402 tristates when voltage 500 is near reference voltage 503. In one embodiment, boost buffer 402 may tristate when voltage 500 is higher than reference voltage 503, as is illustrated in FIG. 5. In other embodiments, boost buffer 402 may tristate when voltage 500 is still less than reference voltage 503. The end of the fast charge period 501 is followed by the settling period 504, during which the reference buffer 403 charges capacitive load 401 to further settle voltage 500 towards reference voltage 503. The settling period 504 ends when the reference buffer 403 is tristated at the reference buffer tristate point 505. In one embodiment, the reference buffer 403 is tristated when the voltage 500 has reached reference voltage 503.

Single buffer charge voltage curve 506 depicts the change in voltage across capacitive load 101 as capacitive load 101 is being charged by charging circuit 100 using a single reference buffer 102. As compared to the voltage 500 across a capacitive load 401 charged by high speed charging circuit 400, the single buffer charge voltage curve 506 requires a longer time to settle at reference voltage 503.

Figure 6:
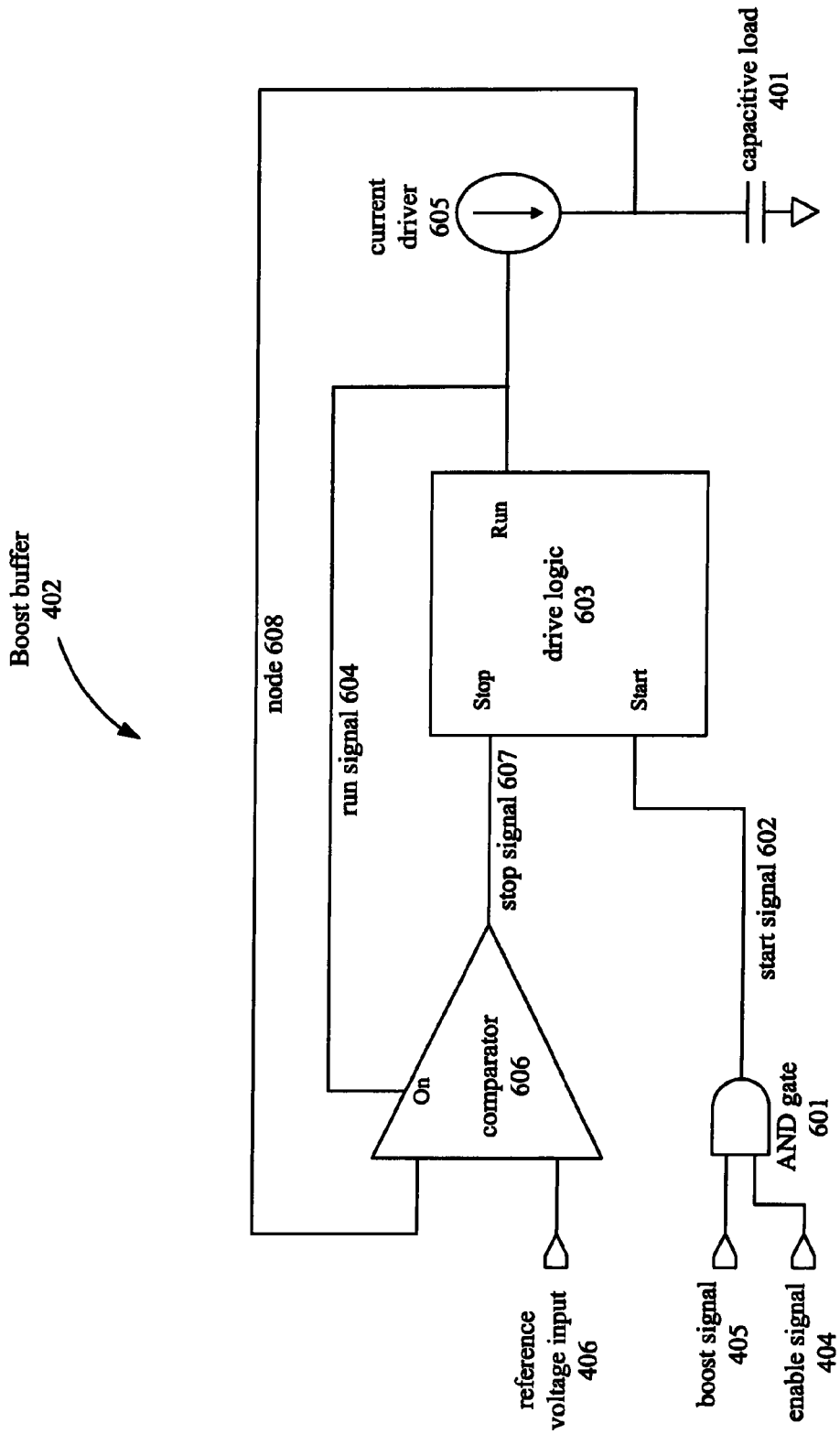
FIG. 6 is a block diagram illustrating one embodiment of a boost buffer.

FIG. 6 is a block diagram illustrating of one embodiment of a boost buffer. In one embodiment, boost buffer 402 may be used in a circuit such as high speed charging circuit 400. As illustrated in FIG. 6, boost buffer 402 includes a boost signal input 405, an enable signal input 404, a logical AND gate 601, a start signal 602, drive logic 603, a run signal 604, a current driver 605, a comparator 606, a capacitive load 401, a node 608, a reference voltage input 406, and a stop signal 607.

The boost 405 and enable 404 signals are inputs to logical AND gate 601 which outputs start signal 602. Thus, start signal 602 will only be asserted true when both the boost 405 and enable 404 signals are true. When start signal 602 is asserted true, drive logic 603 asserts run signal 604 true, which in turn enables current driver 605 and comparator 606. When enabled, current driver 605 drives current into capacitive load 401. Comparator 606, when enabled, compares the voltage $V_N$ at node 608 with the voltage $V_{REF}$ applied to reference voltage input 406. When $V_N$ exceeds $V_{REF}$, comparator 606 trips and asserts stop signal 607 true, which is received by drive logic 603. Upon receiving a true stop signal 607, drive logic 603 asserts run signal 604 false, disabling both current driver 605 and comparator 606. Thus, one embodiment of boost buffer 402 as illustrated in FIG. 6 charges capacitive load 401 until voltage $V_N$ between capacitive load 401 and ground reaches $V_{REF}$.

Figure 7:
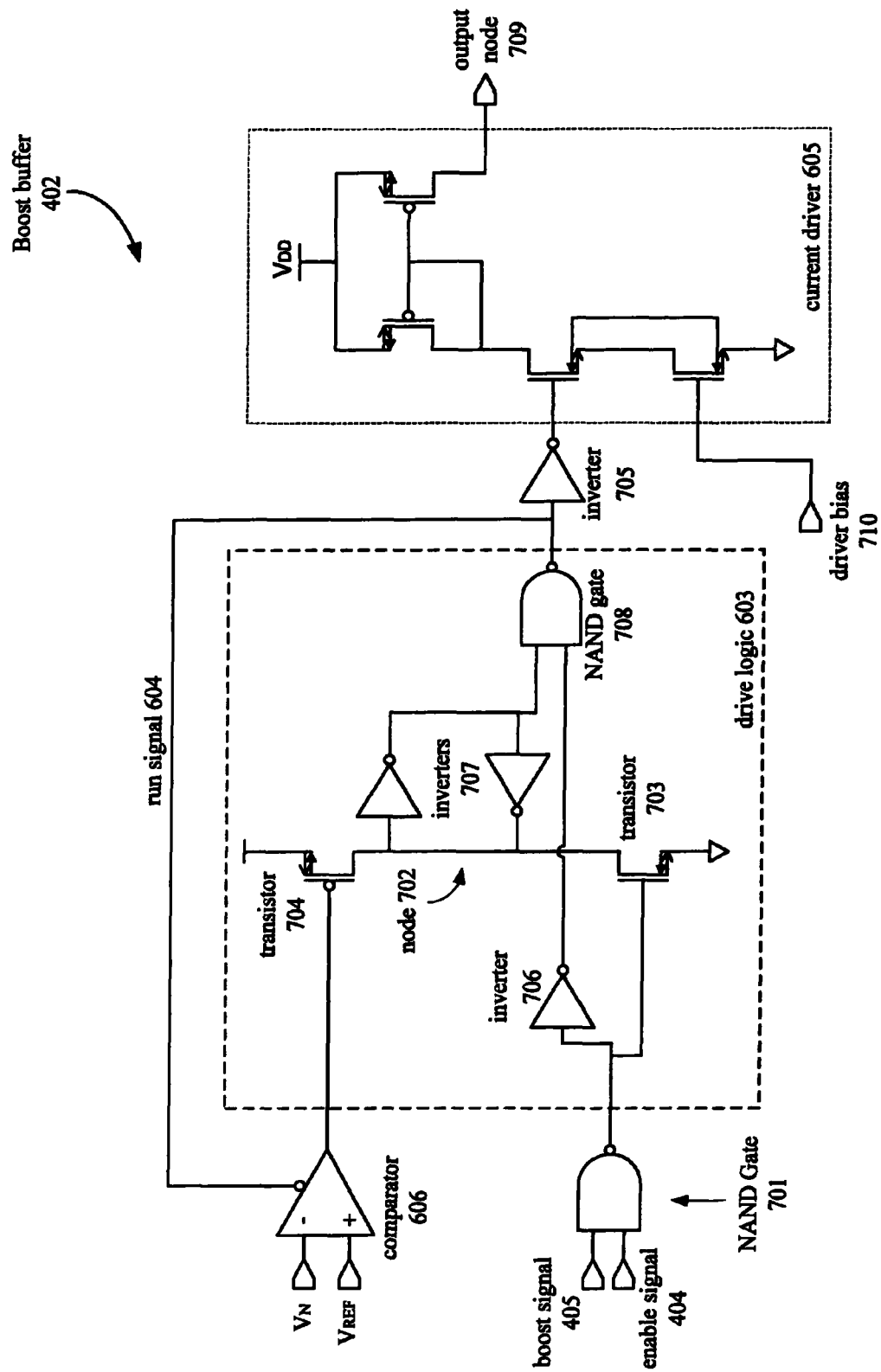
FIG. 7 is a circuit diagram illustrating one embodiment of a boost buffer.

FIG. 7 is a circuit diagram illustrating one embodiment of a boost buffer. The boost buffer illustrated in FIG. 7 includes drive logic 603, current driver 605, boost signal 405, enable signal 404, NAND gate 701, run signal 604, comparator 606, inverter 705, output node 709, and driver bias 710. Drive logic 603 further includes node 702, transistor 703, transistor 704, inverter 706, inverters 707, and NAND gate 708.

Boost buffer 402 is in a disabled state when either boost signal 405 or enable signal 404 is low. Under these conditions, the output of NAND gate 701 is asserted high and node 702 is pulled low through transistor 703. Run signal 604 is consequently asserted high, disabling comparator 606. Comparator 606 maintains its output in the high state while disabled, keeping transistor 704 in the off state and keeping node 702 pulled low. Run signal 604, which is in the high state when boost buffer 402 is disabled, is inverted by inverter 705 before being input to current driver 605. Thus, the low output of inverter 705 maintains current driver 605 in the off state.

When boost buffer 402 is enabled, the output of NAND gate 701 is asserted low. The output of inverter 706 is therefore high. Transistor 703 is turned off by the low output of NAND gate 701, yet the low state on node 702 is maintained by inverters 707. Since both inputs to NAND gate 708 are high, run signal 604 is asserted low, turning on comparator 606. Since run signal 604 is low, the output of inverter 705 is asserted high, turning on current driver 605. Current driver 605 then drives current into output node 709, which is connected to the negative input of comparator 606. Driver bias 710 can be used to set the output current level of current driver 605. Comparator 606 maintains a high voltage on its output until the voltage $V_N$ applied to its negative input surpasses the voltage $V_{REF}$ applied to its positive input. If a capacitive load such as capacitive load 401 is connected between output node 709 and ground, the voltage $V_N$ at the negative input of comparator 606 will increase. When $V_N$ surpasses $V_{REF}$, comparator 606 will trip and its output will be asserted low, causing node 702 to be pulled high through transistor 704. Run signal 604 is consequently asserted high by the output of NAND gate 708, turning off both comparator 606 and current driver 605. Thus, boost buffer 402, when enabled, will charge a capacitive load connected with its output node 709 until the voltage at its output node 709 reaches $V_{REF}$.

Figure 8:
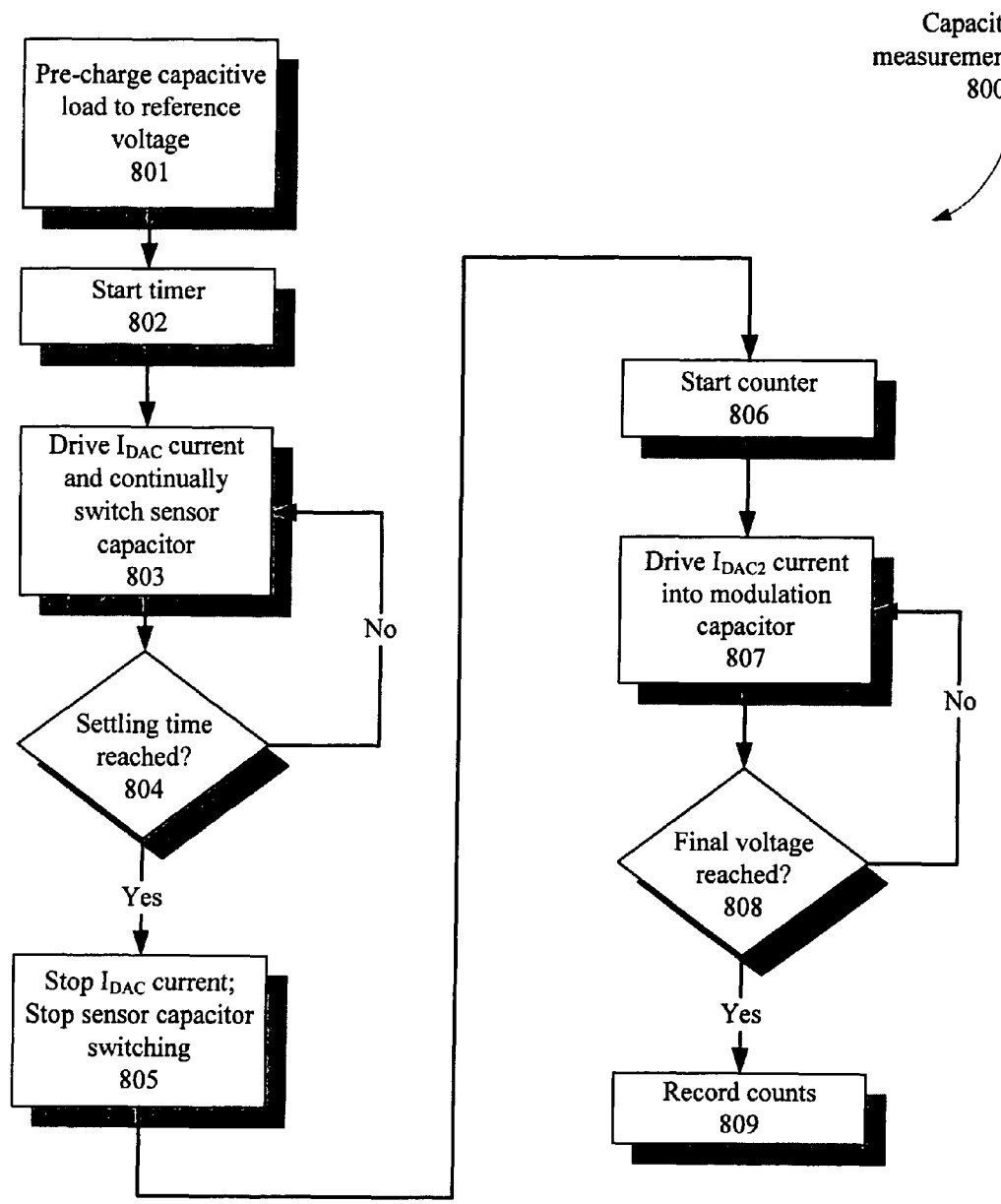
FIG. 8 is a flow chart illustrating one embodiment of a process for determining capacitance of a capacitive sensor.

FIG. 8 is a flow chart illustrating one embodiment of a process for determining capacitance of a capacitive sensor. The order in which some or all of the process blocks appear should not be deemed limiting. Rather, one of ordinary skill in the art will recognize that some or all of the process blocks may be executed in a variety of orders not illustrated. Capacitance measurement process 800 for charging a capacitive load begins at process block 801, where the capacitive load is first pre-charged so that the voltage across the capacitive load reaches a reference voltage $V_{REF}$. According to one embodiment, the pre-charging may be accomplished using a circuit such as high speed charging circuit 400. In process block 802, a timer is started. The timer started in process block 802 operates to monitor the time during which the $I_{DAC}$ current is being driven while the sensor capacitor is being continuously switched, as provided in process block 803. In one embodiment, the $I_{DAC}$ current may be driven using a current source such as current source 302 and the capacitive sensor may be a capacitive sensor such as capacitive sensor 307. For example, current driver 302 may drive current into node 301. According to one embodiment, the continuous switching of the capacitive sensor may be accomplished using switches such as switch 305 and switch 306. For example, switch 305 and switch 306 may be operated in a non-overlapping manner to connect capacitive sensor 307 first to node 301, then to ground. From process block 803, execution proceeds to decision block 804, where a determination is made of whether a settling time has elapsed. For example, the settling time may be chosen to allow sufficient time for the voltage across the capacitive load to stabilize at a steady voltage. Whether or not the settling time has elapsed may be determined by an indication from the timer started in process block 802. If the settling time has not been reached, execution proceeds back to process block 803, and the $I_{DAC}$ current continues to be driven while the sensor capacitor is continually switched. If the settling time has been reached, then execution proceeds to process block 805, where the $I_{DAC}$ current and switching of the sensor capacitor are stopped. Thus, blocks 803 and 804 are repeated until the settling time is reached. In one embodiment, upon completion of process block 805, the voltage across the capacitive load has settled to a steady voltage.

From process block 805, execution proceeds to process block 806, where a counter is started. In one embodiment, the counter may operate in a manner similar to counter 310. For example, counter 310 may record output cycles of oscillator 311 while counter 310 is enabled. In process block 807, the $I_{DAC2}$ current is driven into a modulation capacitor, which is part of the capacitive load. The modulation capacitor may be a capacitor such as modulation capacitor 303. The $I_{DAC2}$ current may or may not be the same as the $I_{DAC}$ current of process block 803. During the execution of process block 807, the voltage across the modulation capacitor increases. In decision block 808, a determination is made of whether the voltage across the modulation capacitor has reached a final voltage. In one embodiment, decision block 808 may be implemented using a comparator, such as comparator 308. For example, comparator 308 trips when the voltage across modulation capacitor 303 as applied to the input of comparator 308 exceeds voltage $V_F$ applied to the other input of comparator 308. Thus, comparator 308 indicates whether or not the final voltage $V_F$ has been reached as provided in decision block 808. If the final voltage has not been reached, then execution proceeds back to process block 807. Thus, blocks 807 and 808 are repeated, so that the $I_{DAC2}$ current is driven into the modulation capacitor until the final voltage is reached. If the final voltage has been reached, then execution proceeds to process block 809, where counts are recorded from the counter started in process block 806. Thus, in one embodiment, the number of counts varies depending on the time required for the $I_{DAC2}$ current to charge the voltage across the modulation capacitor to the final voltage.

In one embodiment, the recorded count value can then be used to determine the presence of an input at the sensor capacitor. For example, the voltage across the modulation capacitor after the completion of process block 805 depends on the capacitance of the sensor capacitor referenced in process block 803. When the capacitance of the sensor capacitor increases because of an input on the sensor capacitor, the voltage across the modulation capacitor is lowered. The time required to charge the modulation capacitor therefore increases because more charge is required to bring the lowered voltage of the modulation capacitor to the final voltage level. The corresponding count value provided by process block 809 therefore increases.

Figure 9:
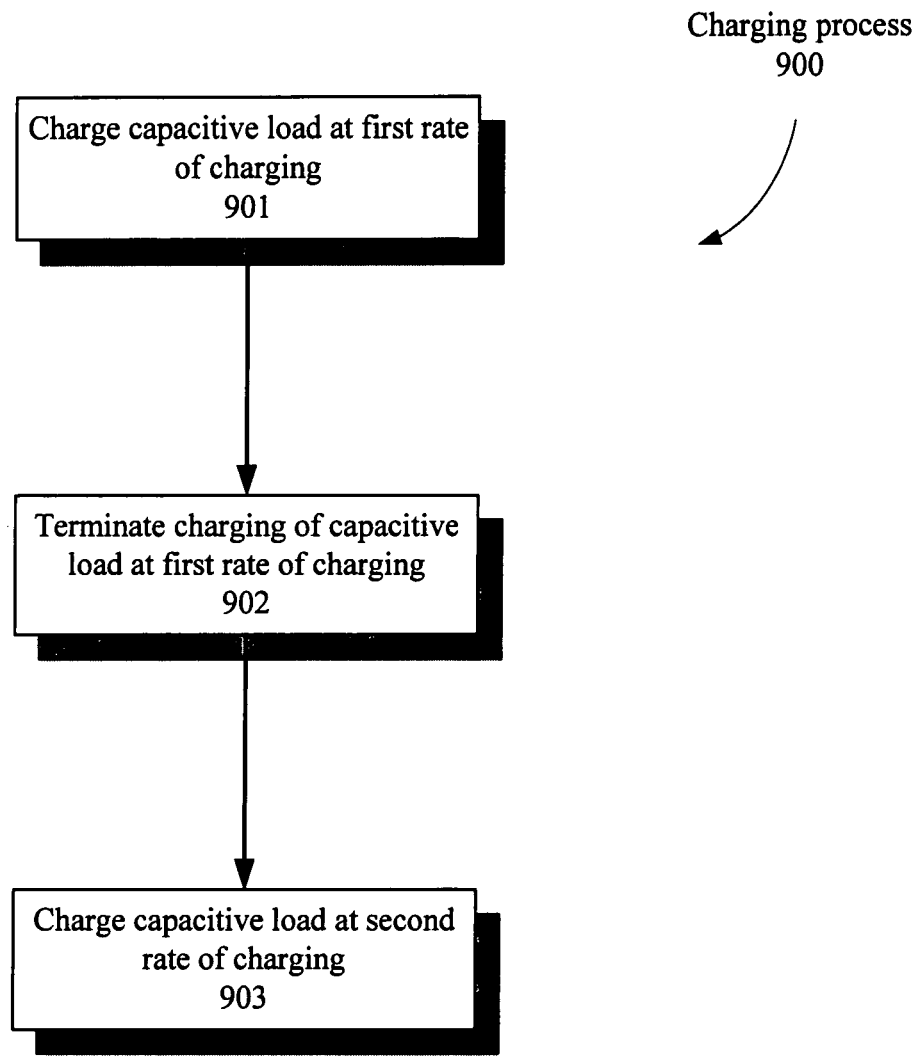
FIG. 9 is a flow chart illustrating one embodiment of a process for charging a capacitive load.

FIG. 9 is a flow chart illustrating one embodiment of a process for charging a capacitive load. According to one embodiment, charging process 900 may be used to pre-charge a capacitive load to a reference voltage as in process block 801. Charging process 900 begins at process block 901, where the capacitive load is charged at a first rate of charging. According to one embodiment, process block 901 may be executed using a boost buffer, such as boost buffer 402. In one embodiment, the rate of charging pertains to the rate at which current is being driven into the capacitive load. In other embodiments, the rate may pertain to other parameters that describe the charging process. For example, the rate may be in terms of an average of the amount of current being driven into the capacitive load over the duration of the charging. In a typical embodiment, the capacitor 401 may be 20 nF and the boost buffer may drive with 1 to 5 mA of charging current, giving charging times on the order of 5 to 25 microseconds. The reference buffer may typically have a drive capability that is ten times less than this example boost buffer. In process block 902, the charging of the capacitive load at the first rate of charging is terminated. In one embodiment where a boost buffer such as boost buffer 402 is used, this can be accomplished by tristating or otherwise disabling the boost buffer. Execution then proceeds to process block 903, where the capacitive load is charged at a second rate of charging. As with process block 901, the rate of charging may in one embodiment pertain to the rate at which current is being driven into the capacitive load being charged, while in other embodiments, the rate pertains to other parameters. In one embodiment, process block 903 may be implemented using a reference buffer such as reference buffer 403. In one embodiment, the reference buffer is enabled prior to the execution of process block 902, while in other embodiments, the reference buffer may be enabled after the execution of process block 902.

Figure 10:
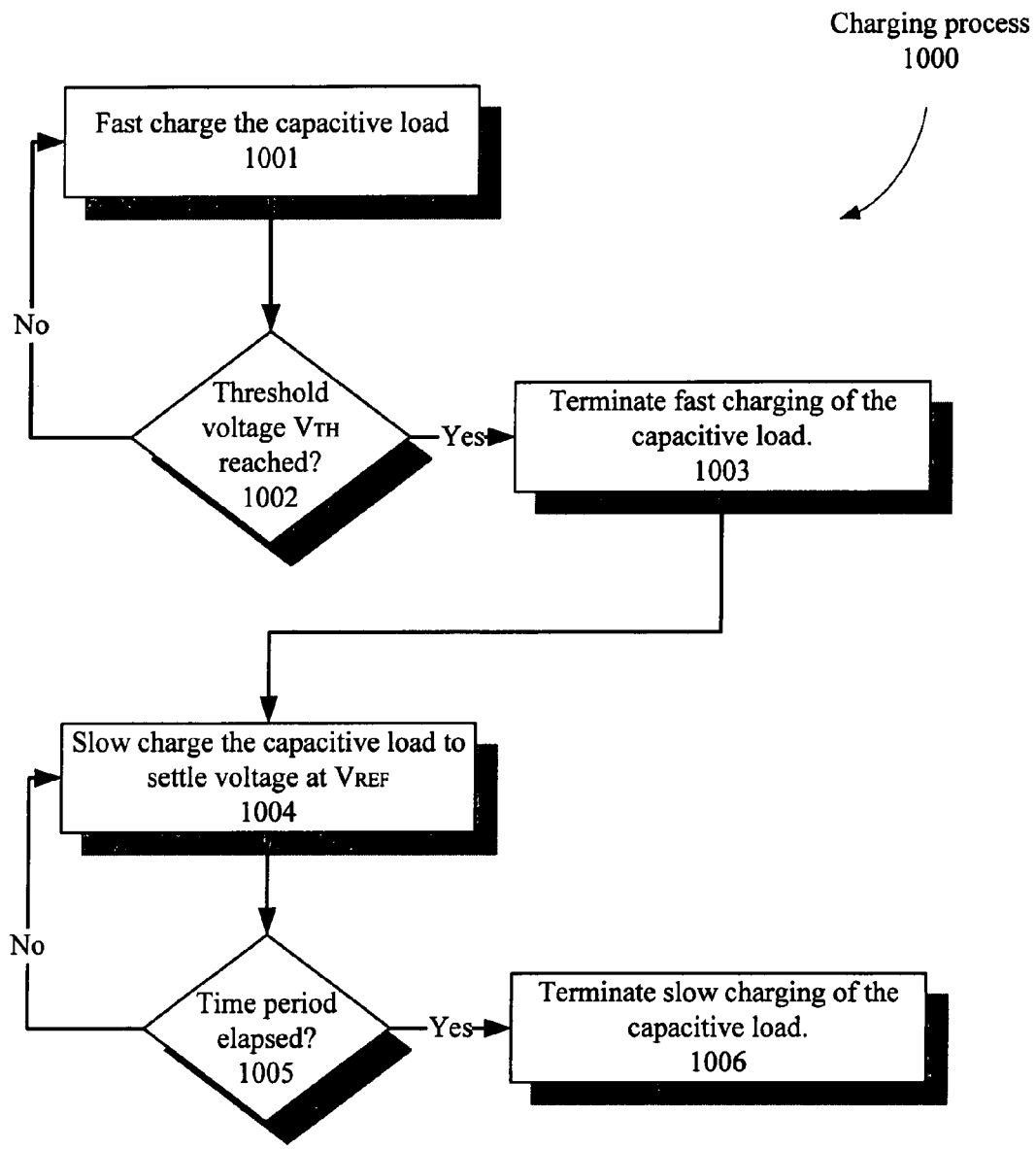
FIG. 10 is a flow chart illustrating one embodiment of a process for charging a capacitive load.

FIG. 10 is a flow chart illustrating one embodiment of a process for charging a capacitive load. According to one embodiment, charging process 1000, as illustrated in FIG. 10, may be used to pre-charge a capacitive load as described in process block 801 of FIG. 8. Charging process 1000 begins with process block 1001, where the capacitive load is subjected to a fast charge. In one embodiment, process block 1001 may be implemented using a boost buffer such as boost buffer 402, as illustrated in FIG. 7. For example, boost buffer 402 may drive current into the capacitive load to increase the capacitive load voltage. Execution then proceeds to decision block 1002, where the voltage across the capacitive load is evaluated to determine whether it has reached a threshold voltage $V_{TH}$. In one embodiment, process block 1002 can be implemented using a comparator such as comparator 606. Comparator 606 may effect the execution of process block 1002 by comparing $V_{TH}$ with the capacitive load voltage and changing its output when the capacitive load voltage exceeds $V_{TH}$. In one embodiment, $V_{TH}$ is near a reference voltage $V_{REF}$ that is the target voltage level for the charging process. According to one embodiment, $V_{TH}$ may be higher than $V_{REF}$, while in other embodiments, $V_{TH}$ is lower than $V_{REF}$. If the voltage across the capacitive load has not reached $V_{TH}$, upon execution of decision block 1002, execution returns to process block 1001, where the capacitive load continues being charged at a fast rate. Thus blocks 1001 and 1002 are repeated until the capacitive load voltage reaches $V_{TH}$. If the capacitive load voltage has reached $V_{TH}$, then upon evaluating decision block 1002, execution proceeds to process block 1003, where the fast charging of the capacitive load is terminated. In one embodiment where fast charging is accomplished using a boost buffer such as boost buffer 402, process block 1003 may be performed by tristating the boost buffer output. In other embodiments, decision block 1002 may determine procedure based upon a duration of time or other parameters, rather than a voltage level. Execution then proceeds to process block 1004, where the capacitive load is subjected to a slow charging to settle the capacitive load voltage at reference voltage $V_{REF}$. Process block 1004 may be accomplished using a reference buffer such as reference buffer 403 as illustrated in FIG. 4. For example, reference buffer 403 may drive current into or sink current from the capacitive load in order to settle the capacitive load voltage at $V_{REF}$. Execution then proceeds to decision block 1005, where a determination is made of whether a time period has elapsed. For instance, decision block 1005 may be implemented using a timer or counter. According to one embodiment, decision block 1005 is implemented within reference buffer control 407, as illustrated in FIG. 4. For example, reference buffer control 407 may include or be coupled with a timer that indicates when a time period has elapsed. If the relevant time period has not yet elapsed, execution proceeds back to process block 1004, where the capacitive load continues to be slowly charged to settle the capacitive load voltage towards $V_{REF}$. If the relevant time period has elapsed, then execution proceeds to process block 1006, where slow charging of the capacitive load is terminated. In an embodiment where a reference buffer such as reference buffer 403 is used to accomplish the slow charging, terminating the slow charging as described in process block 1006 may be accomplished by tristating the output of the reference buffer. In other embodiments, decision block 1005 may determine procedure based upon a voltage level or other parameters rather than passage of a time period. In one embodiment, criteria for determining when to terminate execution of process block 1004 may be chosen to allow sufficient time for the capacitive load voltage to settle within tolerable limits of $V_{REF}$.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
   charging a capacitive load comprising a capacitive touch sensor at a first rate of charging with a first digital-to-analog current source to cause a voltage level of the capacitive load to approach a predetermined reference voltage level;
   terminating the charging the capacitive load at the first rate of charging, wherein the terminating comprises disabling the first digital-to-analog current source in response to receiving an indication that the voltage level of the capacitive load has reached a threshold voltage away from the predetermined reference voltage level; and
   charging the capacitive load at a second rate of charging with a second digital-to-analog current source to cause the voltage level of the capacitive load to approach a predetermined final voltage level, wherein the first rate of charging is faster than the second rate of charging.

2. The method according to claim 1, wherein the charging the capacitive load at the first rate of charging comprises operating the first digital-to-analog current source connected with the capacitive load to drive current into the capacitive load.

3. The method according to claim 1, further comprising monitoring the voltage level of the capacitive load with a comparator concurrently with the charging the capacitive load at the first rate of charging.

4. The method according to claim 3, further comprising beginning the monitoring the voltage level of the capacitive load with a timer in response to receiving an indication that a current is being driven into the capacitive load.

5. The method according to claim 1, wherein the charging the capacitive load at the second rate of charging comprises operating the second digital-to-analog current source connected with the capacitive load to settle the voltage level of the capacitive load towards the predetermined final voltage level.

6. The method according to claim 1,
   wherein a capacitance of the capacitive load is determined based on recording a number of counts of a timer detected during the charging the capacitive load at the second rate of charging with the second digital-to-analog current source.

7. A method comprising:
   charging a capacitive load comprising a capacitive touch sensor at a first rate of charging with a first digital-to-analog current source to cause a voltage level of the capacitive load to approach a predetermined reference voltage level;
   terminating the charging the capacitive load at the first rate of charging;
   charging the capacitive load at a second rate of charging with a second digital-to-analog current source to cause the voltage level of the capacitive load to approach a predetermined final voltage level, wherein the first rate of charging is faster than the second rate of charging; and
   disabling the second digital-to-analog current source in response to receiving an indication from the timer that a time period has elapsed and that indicates that the voltage level of the capacitive load has reached a threshold voltage away from the predetermined final voltage level.

8. An apparatus for charging a capacitive load, comprising:
a first digital-to-analog current source configured to charge the capacitive load comprising a capacitive touch sensor at a first rate of charging to cause a voltage across the capacitive load to approach a predetermined reference voltage level;
a drive logic module coupled with the first digital-to-analog current source, wherein the drive logic module is configured to control an output state of the first digital-to-analog current source;
a second digital-to-analog current source coupled with the capacitive load, wherein the second digital-to-analog current source is configured to charge the capacitive load at a second rate of charging to cause the voltage across the capacitive load to approach a predetermined final voltage level, wherein the first rate of charging is faster than the second rate of charging; and
a comparator module coupled with the drive logic module, wherein the comparator module is configured to monitor the voltage across the capacitive load, and wherein the drive logic module is further configured to disable the first digital-to-analog current source in response to receiving an indication from the comparator module that the voltage across the capacitive load has reached a threshold voltage away from the predetermined reference voltage level.

9. The apparatus according to claim 8, wherein the comparator module is configured to begin monitoring the voltage across the capacitive load in response to a second indication that a current is being driven into the capacitive load.

10. The apparatus according to claim 8, wherein the drive logic module is configured to disable the first digital-to-analog current source by tristating an output of the first digital-to-analog current source.

11. The apparatus according to claim 8, wherein the capacitive load comprises a modulation capacitor coupled with the current driver.

12. An apparatus comprising:
a first digital-to-analog current source configured to charge a capacitive load comprising a capacitive touch sensor at a first rate of charging to cause a voltage across the capacitive load to approach a predetermined reference voltage level;
a drive logic module coupled with the first digital-to-analog current source, wherein the drive logic module is configured to control an output state of the first digital-to-analog current source;
a second digital-to-analog current source coupled with the capacitive load, wherein the second digital-to-analog current source is configured to charge the capacitive load at a second rate of charging to cause the voltage across the capacitive load to approach a predetermined final voltage level, wherein the first rate of charging is faster than the second rate of charging; and
a reference buffer control module configured to control an output state of the second digital-to-analog current source, wherein the reference buffer control module is configured to disable the second digital-to-analog current source in response to receiving an indication from a timer that a time period has elapsed and that indicates that the voltage level of the capacitive load has reached a threshold voltage away from the predetermined final voltage level.

* * * * *